(12) United States Patent
Nishio et al.

(10) Patent No.: US 7,712,874 B2
(45) Date of Patent: May 11, 2010

(54) ELECTROSTATIC SUCTION TYPE FLUID DISCHARGE DEVICE, ELECTROSTATIC SUCTION TYPE FLUID DISCHARGE METHOD, AND PLOT PATTERN FORMATION METHOD USING THE SAME

(75) Inventors: Shigeru Nishio, Yamatokoriyama (JP); Hironobu Iwashita, Chiyoda-ku (JP); Kazunori Yamamoto, Chiyoda-ku (JP); Kazuhiro Murata, Tokyo (JP)

(73) Assignee: Sharp Kabushiki Kaisha, Osaka-Shi (JP)

( * ) Notice: Subject to any disclaimer, the term of this patent is extended or adjusted under 35 U.S.C. 154(b) by 469 days.

(21) Appl. No.: 10/567,710

(22) PCT Filed: Aug. 5, 2004

(86) PCT No.: PCT/JP2004/011233
§ 371 (c)(1),
(2), (4) Date: Feb. 7, 2006

(87) PCT Pub. No.: WO2005/014179
PCT Pub. Date: Feb. 17, 2005

(65) Prior Publication Data
US 2006/0262163 A1    Nov. 23, 2006

(30) Foreign Application Priority Data
Aug. 8, 2003  (JP) .............................. 2003-206958
Aug. 8, 2003  (JP) .............................. 2003-206962
Aug. 8, 2003  (JP) .............................. 2003-206970

(51) Int. Cl.
    *B41J 2/06* (2006.01)
(52) U.S. Cl. ....................................................... 347/55
(58) Field of Classification Search .................. None
    See application file for complete search history.

(56) References Cited

U.S. PATENT DOCUMENTS 4,328,505 A * 5/1982 Jinnai .......................... 347/80

(Continued)

FOREIGN PATENT DOCUMENTS

CN    1288416 A    3/2001

(Continued)

OTHER PUBLICATIONS

Koichi Saito, "*Theory of the Electrostatic Suction Type Slit Jet*", Electronic Imaging & Devices Research Laboratory, Fuji Xerox Co. Ltd., pp. 185-193.

*Primary Examiner*—Stephen D Meier
*Assistant Examiner*—Alexander C Witkowski
(74) *Attorney, Agent, or Firm*—Edwards Angell Palmer & Dodge LLP; David G. Conlin; David A. Tucker

(57) ABSTRACT

An electrostatic suction type fluid discharge device supplies a drive voltage from a power source between a nozzle and an insulating substrate, so as to supply an electric charge to a discharge material supplied into the nozzle. As a result, the discharge material is discharged from the nozzle hole onto the insulating substrate. The diameter of the hole of the nozzle falls within the range between $\phi 0.01$ μm and $\phi 25$ μm, the power source outputs, as the drive voltage, a bipolar pulse voltage that alternates between positive and negative and has a frequency of not less than 1 Hz.

15 Claims, 24 Drawing Sheets

U.S. PATENT DOCUMENTS

| | | | | |
|---|---|---|---|---|
| 5,655,192 | A | 8/1997 | Denton et al. | |
| 5,888,105 | A | 3/1999 | Brown et al. | |
| 6,096,468 | A * | 8/2000 | Ohno et al. | 430/108.3 |
| 6,126,274 | A * | 10/2000 | Kohyama | 347/55 |
| 6,143,807 | A | 11/2000 | Lin et al. | |
| 6,158,844 | A | 12/2000 | Murakami et al. | |
| 6,285,382 | B1 | 9/2001 | Wakahara et al. | |
| 6,328,393 | B1 * | 12/2001 | Lin et al. | 347/1 |
| 6,328,409 | B1 | 12/2001 | Peeters et al. | |
| 6,328,426 | B1 | 12/2001 | Chahn et al. | |
| 6,340,216 | B1 * | 1/2002 | Peeters et al. | 347/21 |
| 6,416,156 | B1 | 7/2002 | Noolandi et al. | |
| 6,416,157 | B1 | 7/2002 | Peeters et al. | |
| 6,416,158 | B1 | 7/2002 | Floyd et al. | |
| 6,416,159 | B1 | 7/2002 | Floyd et al. | |
| 6,454,384 | B1 | 9/2002 | Peeters et al. | |
| 6,467,862 | B1 | 10/2002 | Peeters et al. | |

FOREIGN PATENT DOCUMENTS

| | | | |
|---|---|---|---|
| JP | 36-13768 | | 8/1961 |
| JP | 56-098172 | | 7/1981 |
| JP | 56098172 | A * | 8/1981 |
| JP | 63-007946 | | 1/1988 |
| JP | 05-116321 | | 5/1993 |
| JP | 05-145708 | A | 6/1993 |
| JP | 08-238774 | | 9/1996 |
| JP | 8-333531 | A | 12/1996 |
| JP | 10-10873 | A | 1/1998 |
| JP | 10-138494 | | 5/1998 |
| JP | 11-259013 | A | 9/1999 |
| JP | 2000-108400 | A | 4/2000 |
| JP | 2000-127410 | | 5/2000 |
| JP | 2001-088306 | | 4/2001 |
| JP | 2002-172786 | A | 6/2002 |
| WO | WO 00/38930 | A1 | 7/2000 |

* cited by examiner

ELECTROSTATIC SUCTION TYPE FLUID DISCHARGE DEVICE, ELECTROSTATIC SUCTION TYPE FLUID DISCHARGE METHOD, AND PLOT PATTERN FORMATION METHOD USING THE SAME

TECHNICAL FIELD

The present invention relates to an electrostatic suction type fluid discharge device that electrically charges a conductive fluid such as ink, and conducts electrostatic sucking of the fluid through a nozzle so as to discharge the fluid onto an object such as a substrate.

BACKGROUND ART

Typical examples of fluid jet methods for discharging a fluid such as ink onto an object (recording medium) are a piezo type and a thermal type that are commercially utilized in ink jet printers. In addition to them, there is an electrostatic suction type which is arranged as follows: the fluid to be discharged have electrical conductivity, and an electric field is applied to the conductive fluid so that the fluid is discharged through a nozzle.

Such an electrostatic suction type fluid discharge device is disclosed in, for example, Japanese Examined Patent Publication 36-13768 (published on Aug. 18, 1961) and Japanese Laid-Open Patent Application No. 2001-88306 (published on Apr. 3, 2001).

Also, Japanese Laid-Open Patent Application No. 2000-127410 (published on May 9, 2000) discloses a device arranged such that a nozzle hole is slit-shaped and a protruding needle electrode is formed in the nozzle hole, and an ink including fine particles is discharged using the needle electrode. Japanese Laid-Open Patent Application No. 8-238774 (published on Sep. 17, 1996) discloses a device in which an electrode for applying a voltage is provided in an ink container from which an ink is supplied to a nozzle hole.

The following describes a fluid discharge model in a conventional electrostatic suction type fluid discharge device.

Design factors of electrostatic suction type fluid discharge devices, especially of on-demand electrostatic suction type fluid discharge devices are, conductivity of an ink fluid (e.g. specific resistance of $10^6$ to $10^{11}$ Ωcm), surface tension (e.g. 0.020 to 0.040N/m), viscosity (e.g. 0.011 to 0.015 Pa·s), and applied voltage (electric field). As to the applied voltage, it has been considered that the voltage applied to the nozzle and the distance between the nozzle and an opposing electrode are particularly important.

The electrostatic suction type fluid discharge devices utilize electrofluid instability, as shown in FIG. 32. Placing a conductive fluid in a uniform electric field, an electrostatic force exerted on the surface of the conductive fluid causes the surface to be instable, thereby precipitating the development of a thread (electrostatic thread-like phenomenon). The electric field on this occasion is defined as E0 which is generated when a voltage V is applied between a nozzle and an opposing electrode. The distance between a nozzle hole at the tip of the nozzle and the opposing electrode is defined as h. A development wavelength λC in the aforesaid case can be physically figured out (see, e.g. The Institute of Image Electronics Engineers of Japan, Vol. 17, No. 4, 1988, pp. 185-193), and the developing wavelength λC is represented by the following equation.

$$\lambda_c = \frac{2\pi\gamma}{\varepsilon_0}E_0^{-2} \quad (1)$$

In the equation, γ is surface tension (N/m), ∈0 is dielectric constant (F/m) in a vacuum, and E0 is electric field strength (V/m). If the nozzle diameter d(m) is shorter than λC, the development does not occur. That is, the condition of the discharging is defined as follows.

$$d > \frac{\lambda_c}{2} = \frac{\pi\gamma}{\varepsilon_0 E_0^2} \quad (2)$$

Provided that E0 is an electric field strength (V/m) on the assumption that a parallel flat plate is adopted, h(m) is the distance between the nozzle and opposing electrode, and V0 is a voltage applied to the nozzle, the following equation is given:

$$E_0 = \frac{V_0}{h} \quad (3)$$

Therefore, the following formula is also given:

$$d > \frac{\pi\gamma h^2}{\varepsilon_0 V_0^2} \quad (4)$$

The fluid discharge devices have typically been required to reduce the diameter of the nozzle through which ink is discharged, in order to form finer dots and lines.

However, in the currently-used piezo or thermal fluid discharge devices, it is difficult to reduce the nozzle diameter and discharge, for example, a very small amount of fluid less than 1 pl. This is because, the smaller the nozzle for discharging a fluid is, the more the pressure required for the discharge increases.

In addition to the above, in the aforesaid fluid discharge devices, the miniaturization of droplets contradicts the improvement of precision, and hence it has been difficult to realize both of these improvements at the same time. The reason of this will be described below.

Kinetic energy imparted to the droplet discharged from the nozzle is in proportion to the cube of the diameter of the droplet. Therefore, the minute droplets discharged in a case where the nozzle is miniaturized cannot attain the kinetic energy sufficient to resist the air resistance at the time of the discharge, and the droplets are disturbed by accumulated air or the like. For this reason, it is not possible to expect precise landing of the droplets. Moreover, since the effect of the surface tension increases as the size of the droplets decreases, the vapor pressure of the droplets increases and an amount of evaporation increases. As a result, a great amount of each minute droplet gets lost while flying, and each droplet hardly retains its shape at the time of landing.

In addition to the above, according to the aforesaid fluid discharge model of the conventional electrostatic suction type fluid discharge devices, the reduction of the nozzle diameter demands the increase in the electric field strength, which is necessary for the discharge, as the above-described equation (2) shows. The electric field strength is, as shown in the equation (3), determined by the voltage (drive voltage) V0 applied to the nozzle and the distance h between the nozzle and opposing electrode. Therefore, the reduction of the nozzle diameter results in the increase in the drive voltage.

The drive voltage in the conventional electrostatic suction type fluid discharge devices is very high (not less than 1000V). It is therefore difficult to achieve the reduction in size and the density growth, in consideration of leaks and interferences between the nozzles. Also, the problem becomes serious as the nozzle diameter is further reduced. A power semiconductor with a high voltage of not less than 1000V is typically expensive and does not excel in frequency responsiveness.

In the Japanese Examined Patent Publication 36-13768, the nozzle diameter is 0.127 mm. The range of the nozzle diameter in Japanese Laid-Open Patent Application No. 2001-88306 is 50 to 2000 µm, more preferably 100 to 1000 µm.

As to the nozzle diameter, the development wavelength $\lambda C$ is worked out as follows, if typical operating conditions of the conventional electrostatic suction type fluid discharge are applied: the development wavelength $\lambda C$ is about 140 µm where the surface tension is 0.020N/m and the electric field strength is $10^7$V/m in the aforesaid equation (1). Consequently, the limit nozzle diameter is 70 µm. It has therefore been considered that, in a case where the nozzle diameter is not more than about 70 µm in the aforesaid conditions, the ink development does not occur even if the field strength is high ($10^7$V/m), unless a countermeasure such as forcible formation of meniscus by the application of a back pressure is carried out. In short, it has been considered that the miniaturization of the nozzle is not compatible with the reduction in the drive voltage.

As described above, in the conventional fluid discharge devices, the miniaturization of the nozzle contradicts with the improvement of precision, and it has been difficult to achieve both of these improvements. In particular, regarding the electrostatic suction type fluid discharge devices, it has been considered that the miniaturization of the nozzle contradicts with the reduction in the drive voltage.

DISCLOSURE OF INVENTION

The present invention was done to solve the above-identified problem. The objective of the present invention is to attain an electrostatic suction type fluid discharge device in which the nozzle is miniaturized in size, a minute fluid is precisely discharged, the precision of the landing position is improved, and the drive voltage is reduced.

To achieve this objective, the electrostatic suction type fluid discharge device of the present invention, in which drive voltage supply means supplies a drive voltage between a nozzle and a discharge target such as an insulating substrate and hence an electric charge is applied to a fluid supplied into the nozzle, so that the fluid is discharged from a hole of the nozzle to the discharge target, is characterized in that, the hole of the nozzle falls within a range between φ0.01 µm and φ25 µm in diameter, and the drive voltage supply means outputs, as the drive voltage, a bipolar pulse voltage which alternates between positive and negative and has a frequency of not less than 1 Hz.

An electrostatic suction type fluid discharge method, in which a drive voltage is supplied between a nozzle and a discharge target such as an insulating substrate and hence an electric charge is applied to a fluid supplied into the nozzle, so that the fluid is discharged from a hole of the nozzle to the discharge target, is characterized in that, the hole of the nozzle falls within a range between φ0.01 µm and φ25 µm in diameter, and the drive voltage is a bipolar pulse voltage which alternates between positive and negative and has a frequency of not less than 1 Hz.

In regard of conventional electrostatic suction type fluid discharge devices, it has been considered that the reduction in the diameter of the nozzle hole is not compatible with the reduction in the drive voltage, because the reduction in the diameter of the nozzle hole is accompanied with the increase in the electric field strength required for the discharge. According to the present invention, meanwhile, it was newly found that a local electric field is generated in a case where the nozzle hole diameter is minute, i.e. in the range of φ0.01 µm to φ25 µm, and the drive voltage for the discharge can be reduced, and based on this novel finding, the miniaturization and the reduction in the drive voltage are both achieved by causing the nozzle hole diameter to fall within the aforesaid range.

According to the arrangement above, the drive voltage applied to the nozzle is a bipolar pulse voltage that alternates between positive and negative, and the voltage has a frequency of not less than 1 Hz. On this account, it is possible to restrain (i) the enlargement of an area where droplets scatter on the discharge target on account of the charge-up of the discharge target, and (ii) the increase in the drive voltage. Therefore, t the miniature pattern on the discharge target is clearly formed by driving the nozzle with a low voltage.

The electrostatic suction type fluid discharge device of the present invention, in which drive voltage supply means supplies a drive voltage between a nozzle and a discharge target and hence an electric charge is applied to a fluid supplied into the nozzle, so that the fluid is discharged from a hole of the nozzle to the discharge target, is characterized in that, the hole of the nozzle falls within a range between φ0.01 µm and φ25 µm in diameter, and the drive voltage supply means outputs, as the drive voltage, a bipolar pulse voltage which alternates between positive and negative and satisfies $f \leq 1/(2\tau)$ where $\tau$ is a time constant determined by $\tau = \in/\sigma$, f is a drive voltage frequency (Hz), $\sigma$ is an electric conductivity (S/m) of the discharge fluid, and $\in$ is a relative permittivity of the discharge fluid.

Also, the electrostatic suction type fluid discharge method of the present invention, in which a drive voltage is supplied between a nozzle and a discharge target and hence an electric charge is applied to a fluid supplied into the nozzle, so that the fluid is discharged from a hole of the nozzle to the discharge target, is characterized in that, the hole of the nozzle falls within a range between φ0.01 µm and φ25 µm in diameter, and the drive voltage being a bipolar pulse voltage which alternates between positive and negative and satisfies $f \leq 1/(2\tau)$ where $\tau$ is a time constant determined by $\tau = \in/\sigma$, f is a drive voltage frequency (Hz), $\sigma$ is an electric conductivity (S/m) of the discharge fluid, and $\in$ is a relative permittivity of the discharge fluid.

In regard of conventional electrostatic suction type fluid discharge devices, it has been considered that the reduction in the diameter of the nozzle hole is not compatible with the reduction in the drive voltage, because the reduction in the diameter of the nozzle hole is accompanied with the increase in the electric field strength required for the discharge. According to the present invention, meanwhile, it was newly found that a local electric field is generated in a case where the nozzle hole diameter is minute, i.e. in the range of φ0.01 µm to φ25 µm, and the drive voltage for the discharge can be reduced, and based on this novel finding, the miniaturization and the reduction in the drive voltage are both achieved by causing the nozzle hole diameter to fall within the aforesaid range.

In the arrangement above, the drive voltage applied to the nozzle is a bipolar pulse voltage that alternates between positive and negative, and the voltage satisfies $f \leq 1/(2\tau)$ where $\tau$ is a time constant determined by $\tau = \in/\sigma$, f is a drive voltage frequency (Hz), $\sigma$ is an electric conductivity (S/m) of the discharge fluid, and $\in$ is a relative permittivity of the discharge fluid. On this account, the increase in the discharge minimum voltage in regard of the discharge from the nozzle is restrained, the area where the droplets scatters on the discharge target is narrowed, and hence a clear minute pattern is formed on the discharge target.

The electrostatic suction type fluid discharge device, in which drive voltage supply means supplies a drive voltage between a nozzle and a discharge target and hence an electric charge is applied to a fluid supplied into the nozzle, so that the fluid is discharged from a hole of the nozzle to the discharge target, and the nozzle and the discharge target are moved in a relative manner by shifting means, in a direction orthogonal to a direction along which the nozzle and the discharge target oppose to each other, is characterized in that, the hole of the nozzle falls within a range between ϕ0.01 μm and ϕ25 μm in diameter, the drive voltage supply means outputs, as the drive voltage, a bipolar pulse voltage which alternates between positive and negative and has a frequency of fHz, and the electrostatic suction type fluid discharge device further comprises control means that controls at least one of the drive voltage supply means and the shifting means in such a manner as to satisfy $f \geq 5v$ where f is a drive voltage frequency (Hz) of the drive voltage supply means and v indicates a relative speed (μm/sec) of the relative movement of the nozzle and the discharge target.

The electrostatic suction type fluid discharge method of the present invention, in which a drive voltage is supplied between a nozzle and a discharge target and hence an electric charge is applied to a fluid supplied into the nozzle, so that the fluid is discharged from a hole of the nozzle to the discharge target, and the nozzle and the discharge target are moved in a relative manner, in a direction orthogonal to a direction along which the nozzle and the discharge target oppose to each other, is characterized in that, the hole of the nozzle falls within a range between ϕ0.01 μm and ϕ25 μm in diameter, as the drive voltage, a bipolar pulse voltage which alternates between positive and negative and has a frequency of fHz is outputted, and at least one of the drive voltage frequency fHz and a relative speed vμm/sec of the relative movement of the nozzle and the discharge target is controlled in such a manner as to satisfy $f \geq 5v$.

In regard of conventional electrostatic suction type fluid discharge devices, it has been considered that the reduction in the diameter of the nozzle hole is not compatible with the reduction in the drive voltage, because the reduction in the diameter of the nozzle hole is accompanied with the increase in the electric field strength required for the discharge. According to the present invention, meanwhile, it was newly found that a local electric field is generated in a case where the nozzle hole diameter is minute, i.e. in the range of ϕ0.01 μm to ϕ25 μm, and the drive voltage for the discharge can be reduced, and based on this novel finding, the miniaturization and the reduction in the drive voltage are both achieved by causing the nozzle hole diameter to fall within the aforesaid range.

Furthermore, as the drive voltage, a bipolar pulse voltage which alternates between positive and negative and has a frequency of fHz is applied to the nozzle, and at least one of the drive voltage frequency fHz and the relative movement speed vμm/sec of the relative movement of the nozzle and the discharge target is controlled in such a manner as to satisfy $f \geq 5v$. On this account, the scatter of the droplets on the discharge target is restrained, and hence a clear minute pattern is formed.

The electrostatic suction type fluid discharge device of the present invention, in which drive voltage supply means supplies a drive voltage between a nozzle and a discharge target and hence an electric charge is applied to a fluid supplied into the nozzle, so that the fluid is discharged from a hole of the nozzle to the discharge target, and the nozzle and the discharge target are moved in a relative manner by shifting means, in a direction orthogonal to a direction along which the nozzle and the discharge target oppose to each other, is characterized in that, the hole of the nozzle falls within a range between ϕ0.01 μm and ϕ25 μm in diameter, and the drive voltage supply means outputs, as the drive voltage, a bipolar pulse voltage which alternates between positive and negative and is not more than 400V.

The electrostatic suction type fluid discharge method of the present invention, in which a drive voltage is supplied between a nozzle and a discharge target and hence an electric charge is applied to a fluid supplied into the nozzle, so that the fluid is discharged from a hole of the nozzle to the discharge target, is characterized in that, the hole of the nozzle falls within a range between ϕ0.01 μm and ϕ25 μm in diameter, and the drive voltage is a bipolar pulse voltage which alternates between positive and negative and is not more than 400V.

In regard of conventional electrostatic suction type fluid discharge devices, it has been considered that the reduction in the diameter of the nozzle hole is not compatible with the reduction in the drive voltage, because the reduction in the diameter of the nozzle hole is accompanied with the increase in the electric field strength required for the discharge. According to the present invention, meanwhile, it was newly found that a local electric field is generated in a case where the nozzle hole diameter is minute, i.e. in the range of ϕ0.01 μm to ϕ25 μm, and the drive voltage for the discharge can be reduced, and based on this novel finding, the miniaturization and the reduction in the drive voltage are both achieved by causing the nozzle hole diameter to fall within the aforesaid range.

Moreover, the drive voltage applied to the nozzle is a bipolar pulse voltage that alternates between positive and negative and is not more than 400V. On this account, in a case where dots are formed by discharging a fluid onto the discharge target, the scatter of the droplets around the dots is restrained, so that a clear minute pattern is formed.

The electrostatic suction type fluid discharge device of the present invention, which (i) discharges, by electrostatic suction, a discharge fluid through a fluid discharge hole of a nozzle of a fluid discharge head, the discharge fluid being electrically charged by voltage application, and (ii) causes the discharge fluid to land onto a substrate, (iii) so as to form a drawing pattern by the discharge fluid on a surface of the substrate, is characterized in that, the fluid discharge hole of the nozzle falls in a range between 0.01 μm and 25 μm in diameter, and the substrate is insulating, the electrostatic suction type fluid discharge device comprises: charge removal means for removing an electric charge on the surface of the substrate, before the discharge fluid is discharged onto the substrate; and fluid discharge means for discharging, by a positive and negative bipolar pulse voltage, the discharge fluid onto the substrate from which electricity has been removed.

According to the arrangement above, the fluid discharge hole diameter (nozzle diameter) of the nozzle is minute, i.e. in the range of 0.01 to 25 μm, so that a local electric field is generated. On this account, the reduction in the nozzle diameter can result in the reduction in the drive voltage. This decrease in the drive voltage is extremely advantageous for the reduction in the size of the device and the increase in the concentration of the nozzles. As a matter of course, the reduction in the drive voltage makes it possible to use a low-voltage-driven driver which is advantageous in terms of costs.

Furthermore, in the above-described discharge model, the electric field strength required for the discharge depends on the strength of a locally-concentrated electric field. For this reason, an opposing electrode is not necessarily provided. That is, it is possible to perform printing onto an insulating substrate or the like, without using an opposing electrode, and hence the degree of freedom of the device arrangement is improved. Moreover, the printing can be done onto a thick insulating body.

In a case where an electric charge adheres onto the insulating substrate, the aforesaid miniaturization of the nozzle causes the following problem: the minute pattern cannot be stably formed as the minute pattern formed by the discharge is disturbed or the discharge failure occurs, on account of the electric field repulsive force of the adhered electric charge.

In view of this problem, in the aforesaid electrostatic suction type fluid discharge device, the electric charge on the insulating substrate is removed by charge removal means before the fluid discharge onto the insulating substrate, and then the fluid discharge means performs, using a positive and negative bipolar pulse voltage, the fluid discharge onto the insulating substrate which has been subjected to the charge removal. On this account, it is possible to stably perform the discharge while the charge-up of the insulating substrate is restrained.

In the electrostatic suction type fluid discharge device, the charge removal means performs the charge removal of the insulating substrate, in line with a predetermined pattern.

According to this arrangement, the charge removal means can perform the charge removal in a necessary part of the insulating substrate, in line with desired patterning data. On this account, the charge removal by the charge removal means is not necessarily performed on the entirety of the insulating substrate, and hence, as the charge removal means, it is possible to adopt a needle-shaped charge removal head that does not require a high voltage. For this reason, it is possible to control the charge removal means by a low-voltage driver which is advantageous in terms of costs. Furthermore, since the charge removal is performed only in a necessary part of the insulating substrate, a time for the charge removal is short.

The above-described electrostatic suction type fluid discharge device is preferably arranged so that, the fluid discharge means discharges the discharge fluid by applying a voltage which is arranged such that an electric field strength generated by electric charge concentration at a meniscus part, when discharging the discharge fluid, is smaller than a discharge start electric field strength figured out by an equation for calculating Paschen curve.

According to the arrangement above, it is possible to restrain the occurrence of aerial discharge at the time of the fluid discharge using the fluid discharge means. On this account, a clear minute pattern image is formed without the fear of the scatter of minute fluid droplets in the peripheral part on account of the electric discharge.

The electrostatic suction type fluid discharge device of the present invention, which (i) discharges, by electrostatic suction, a discharge fluid through a fluid discharge hole of a nozzle of a fluid discharge head, the discharge fluid being electrically charged by voltage application, and (ii) causes the discharge fluid to land onto a substrate, (iii) so as to form a drawing pattern by the discharge fluid on a surface of the substrate, is characterized in that, the fluid discharge hole of the nozzle falls in a range between 0.01 μm and 25 μm in diameter, and the substrate is insulating, the electrostatic suction type fluid discharge device comprises: electric charge providing means for providing an electric charge to a surface of the substrate, in line with a predetermined pattern.

According to the arrangement above, the fluid discharge hole diameter (nozzle diameter) of the nozzle is minute, i.e. in the range of 0.01 to 25 μm, so that a local electric field is generated. In this manner, the miniaturization of the nozzle makes it possible to reduce the drive voltage for the discharge. This decrease in the drive voltage is extremely advantageous for the reduction in the size of the device and the increase in the concentration of the nozzles. As a matter of course, the reduction in the drive voltage makes it possible to adopt a low-voltage-driven driver which is advantageous in terms of costs.

Furthermore, in the above-described discharge model, the electric field strength required for the discharge depends on the strength of a locally-concentrated electric field. For this reason, an opposing electrode is not necessarily provided. That is, it is possible to perform printing onto an insulating substrate or the like, without using an opposing electrode, and hence the degree of freedom of the device arrangement is improved. Moreover, the printing can be done onto a thick insulating body.

In a case where an electric voltage adheres onto the insulating substrate, the aforesaid miniaturization of the nozzle cause the following problem: the minute pattern cannot be stably formed as the minute pattern formed by the discharge is disturbed or the discharge failure occurs, on account of the electric field repulsive force of the adhered electric charge.

In view of this problem, before drawing a pattern by the discharge fluid, the electric charge providing means can provide an electric charge to the surface of the insulating substrate in line with a predetermined pattern. With this electric discharge pattern, it is possible to prevent the disturbance in the pattern drawn by the fluid discharged from the minute nozzle and the discharge failure. On this account, the minute pattern is stably formed.

For example, the polarity of the electric charge provided by the electric charge providing means is in reverse to the polarity of the drive voltage, and a desired provided electric charge pattern is formed in line with patterning data. Then the fluid discharge is performed directly above the provided electric charge pattern, so that a pulling electric field force is generated on account of the provided electric charge. On this account, a clear minute pattern is formed.

Alternatively, the polarity of the electric charge provided by the electric charge providing means is identical with the polarity of the drive voltage, and the provided electric charge pattern is formed on the insulating substrate so as to surround a desired pattern. Then the fluid discharge is performed directly above the desired pattern part surrounded by the provided electric charge pattern. With this, immediately before the landing on the insulating substrate, the discharged fluid receives the electric field repulsion force of the provided electric charge in the lateral direction, so that the droplets land in the direction of concentration to the desired pattern. For this reason, the minute pattern is clearly formed.

The above-described electrostatic suction type fluid discharge device may be arranged in such a manner that, the electric charge providing means provides the electric charge to an insulating substrate made of a photoconductive material, the electric charge providing means including: uniform electric charging means for uniformly charging the surface of the insulating substrate; and charge removal means for applying, in line with a predetermined pattern, a laser beam to the surface being uniformly charged, so as to remove electricity from a part of the surface where the laser beam has been applied.

According to the arrangement above, in a case where the provided electric charge pattern is formed, in particular, in a case where the polarity of the provided electric charge pattern is identical with the polarity of the drive voltage (i.e. in a case where a desired pattern surrounded by the provided electric charge pattern is a drawing pattern area), the drawing pattern area formed by the application of the laser beam is accurate because the diameter of the laser spot can be minimized to about 5 μm. For this reason, an accurate pattern is formed as compared to a case where, for example, the electric charge is provided using a needle electrode.

The electrostatic suction type fluid discharge device of the present invention, which (i) discharges, by electrostatic suction, a discharge fluid through a fluid discharge hole of a nozzle of a fluid discharge head, the discharge fluid being electrically charged by voltage application, and (ii) causes the discharge fluid to land onto a substrate, (iii) so as to form a drawing pattern by the discharge fluid on a surface of the substrate, is characterized in that, the fluid discharge hole of the nozzle falls in a range between 0.01 μm and 25 μm in diameter, the substrate is insulating, and the voltage application means is capable of touching the insulating substrate on which a pattern of a conductive material is formed, the electrostatic suction type fluid discharge device comprises: voltage application means that applies a voltage to a conductive part on the insulating substrate, when the electrostatic suction type fluid discharge device discharges the discharge fluid.

According to the arrangement above, in a case where a conductive pattern has already been formed on the insulating substrate, the voltage application means is brought in touch with the conduction section to be the conductive pattern, and the fluid discharge is performed while a voltage is applied to the conductive section. This makes it possible to increase the degree of concentration of the discharge on the conductive pattern. This arrangement is particularly effective for the over-painting of the line of the conductive pattern and for connecting the lines of the conductive pattern.

A plot formation method of the present invention, using an electrostatic suction type fluid discharge device that (i) discharges, by electrostatic suction, a discharge fluid through a fluid discharge hole of a nozzle of a fluid discharge head, the discharge fluid being electrically charged by voltage application, and (ii) causes the discharge fluid to land onto a substrate, (iii) so as to form a drawing pattern by the discharge fluid on a surface of the substrate, is characterized in that, the fluid discharge hole of the nozzle falls in a range between 0.0 μm and 25 μm in diameter, the substrate is insulating, before the discharge fluid is discharged, an electric charge, whose polarity is in reverse to a polarity of a drive voltage by which the discharge fluid is electrically charged in advance, is applied to a part of the insulating substrate where a drawing pattern is to be formed, so that an electric charge pattern is formed, and the drawing pattern is formed by the discharge fluid, by discharging the discharge fluid on the electric charge pattern.

According to the arrangement above, before the discharge of the discharge fluid, an electric charge pattern is formed where the drawing pattern has been formed, with the electric charge whose polarity is in reverse to the polarity of the drive voltage. Then the fluid discharge is performed directly above the electric charge pattern. With this, a pulling electric field force is generated on account of the provided electric charge, and hence a clear minute pattern is formed.

Another plot formation method of the present invention, using an electrostatic suction type fluid discharge device that (i) discharges, by electrostatic suction, a discharge fluid through a fluid discharge hole of a nozzle of a fluid discharge head, the discharge fluid being electrically charged by voltage application, and (ii) causes the discharge fluid to land onto a substrate, (iii) so as to form a drawing pattern by the discharge fluid on a surface of the substrate, is characterized in that, the fluid discharge hole of the nozzle falls in a range between 0.01 μm and 25 μm in diameter, the substrate is insulating, before the fluid is discharged, an electric charge, whose polarity is identical with a polarity of a drive voltage by which the discharge fluid is electrically charged in advance, is applied around a part on the insulating substrate where a drawing pattern is to be formed, so that an electric charge pattern is formed, and the drawing pattern is formed by the discharge fluid, by discharging the discharge fluid onto a drawing pattern formation area which is surrounded by the electric charge pattern.

According to the arrangement above, before the discharge of the discharge fluid, an electric charge pattern surrounding a desired drawing pattern is formed by an electric charge whose polarity is identical with the polarity of the drive voltage. Since the fluid discharge is performed directly above the desired drawing pattern part surrounded by the electric charge pattern, the droplets land in the direction of concentration to the drawing pattern part. In this manner, the minute pattern is clearly formed.

The above-described plot pattern formation method may be arranged such that, the electric charge pattern is formed in such a manner that, after a surface of the insulating substrate is electrically charged in a uniform manner, a laser beam is applied to the uniformly-charged surface in line with a predetermined pattern, and electricity is removed from a part where the laser beam has been applied.

According to the arrangement above, in a case where the provided electric charge pattern is formed, in particular, in a case where the polarity of the provided electric charge pattern is identical with the polarity of the drive voltage (i.e. in a case where a desired pattern surrounded by the provided electric charge pattern is a drawing pattern area), the drawing pattern area formed by the application of the laser beam is reduced in size because the diameter of the laser spot can be minimized to about 5 μm. For this reason, an accurate pattern is formed as compared to a case where, for example, the electric charge is provided using a needle electrode.

A further plot formation method of the present invention, using an electrostatic suction type fluid discharge device that (i) discharges, by electrostatic suction, a discharge fluid through a fluid discharge hole of a nozzle of a fluid discharge head, the discharge fluid being electrically charged by voltage application, and (ii) causes the discharge fluid to land onto a substrate, (iii) so as to form a drawing pattern by the discharge fluid on a surface of the substrate, is characterized in that, the fluid discharge hole of the nozzle falls in a range between 0.01 μm and 25 μm in diameter, the substrate is insulating, before the discharge fluid is discharged, an electric charge, whose polarity is identical with a polarity of a drive voltage by which the discharge fluid is electrically charged in advance, is applied to a non-image-drawing area where a drawing pattern is not to be formed on the insulating substrate, so that an electric charge pattern is formed, and the drawing pattern is formed while the voltage applied for discharging the discharge fluid is not stopped even on the non-image drawing area.

According to this arrangement, the electric charge pattern formed in the non-image-drawing area is formed at a gap in the drawing pattern formed by continuously performing the fluid discharge. In this manner since the electric charge pattern corresponding to they non-image-drawing area formed in advance on the insulating substrate has the polarity identical with that of the fluid discharge voltage, the non-image-drawing area is suitably formed without stopping the fluid discharge.

Yet another plot formation method of the present invention, using an electrostatic suction type fluid discharge device that (i) discharges, by electrostatic suction, a discharge fluid through a fluid discharge hole of a nozzle of a fluid discharge head, the discharge fluid being electrically charged by voltage application, and (ii) causes the discharge fluid to land onto a substrate, (iii) so as to form a drawing pattern by the discharge fluid on a surface of the substrate, is characterized in that, the fluid discharge hole of the nozzle falls in a range between 0.01 µm and 25 µm in diameter, the substrate is insulating, and in a case where a first drawing pattern made of a conductive material has been formed by a conductive material on the insulating substrate and a second drawing pattern is further formed on the first drawing pattern, the second drawing pattern is formed while a voltage is applied to the conductive part by which the first drawing pattern is made.

According to the arrangement above, in a case where a first conductive pattern has already been formed on the insulating substrate, the fluid discharge is conducted while a voltage is applied to a conductive part which becomes the first conductive pattern. This makes it possible to increase the degree of concentration of the discharge on the conductive pattern. This arrangement is particularly effective for the over-painting of the line of the conductive pattern and for connecting the lines of the conductive pattern.

For a fuller understanding of the nature and advantages of the invention, reference should be made to the ensuing detailed description taken in conjunction with the accompanying drawings.

BRIEF DESCRIPTION OF DRAWINGS

FIG. 10($b$) illustrates the principle of the scattering of droplets on an insulating substrate.

FIG. 14($a$) shows a case where the discharge material is not discharged from the nozzle. FIG. 14($b$) shows a case where the discharge is carried out.

BEST MODE FOR CARRYING OUT THE INVENTION

Presupposed Technology

First, the presupposed technology of the present invention will be described in reference to figures. In an electrostatic suction type fluid discharge device of the presupposed technology of the present invention, the nozzle diameter is 0.01 µm to 25 µm, and the discharge of a discharge fluid can be controlled by a drive voltage of not more than 1000V.

In a conventional fluid discharge model, since the reduction in nozzle diameter requires a higher driving voltage, ink is assumed not to be discharged by a driving voltage of not more than 1000V unless the device is specially designed, for example, a back pressure is applied to the ink. However, the inventors of the present invention have devoted themselves to reviewing, and found that a nozzle having a specific diameter or less causes a discharge phenomenon in a discharge model which differs from the conventional ink discharge model. The presupposed technology was made based on this new ink discharge model.

First, the ink discharge model of the presupposed technology is explained below.

Figure 2:
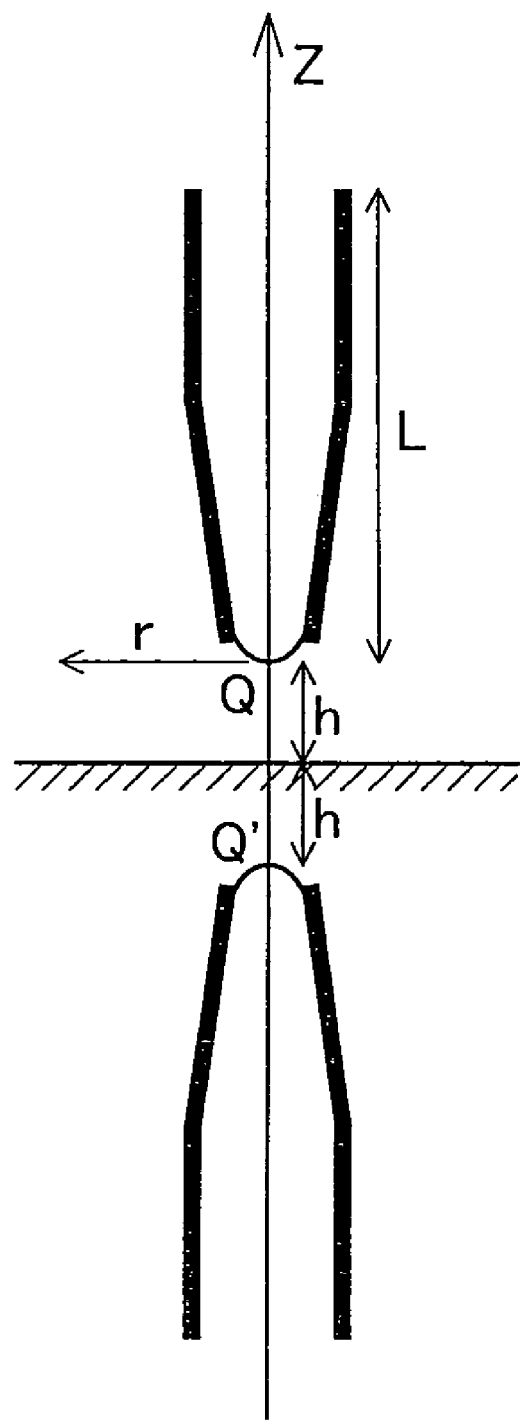
FIG. 2 is used for illustrating the calculation of the electric field strength of a nozzle in a discharge model that is a basic concept of the present invention.

Assuming that a conductive ink is injected into a nozzle having a diameter of d (this hereinafter indicates an internal diameter of nozzle, unless otherwise specified), and the nozzle is positioned at a point of height h, vertically to an infinite flat plate conductor. FIG. 2 shows this state. Here, the electric charge Q induced in the tip of nozzle (nozzle hole; fluid discharge hole), which is assumed to be gathered to a hemispherical part formed by the discharge fluid in the tip of nozzle, is expressed as follows.

$$Q = 2\pi \epsilon_0 \alpha V_0 d \quad (5)$$

In the formula (5), Q (C) expresses a charge induced in the tip of nozzle, $\epsilon_0$ expresses a dielectric constant (F/m) of a vacuum, d expresses a nozzle diameter, and $V_0$ expresses a gross voltage applied to the nozzle. Further, α expresses a proportionality constant which relies on the shape of nozzle and some other factors, α generally being about 1-1.5, and becomes substantially 1 under condition: D<<h (h: distance (m) between nozzle and substrate).

Further, when the substrate is a conducting substrate, it would appear that a mirror image charge Q' having a polarity opposite to that of the charge Q is induced in a symmetrical and opposed position to the nozzle on the substrate. Similarly, when the substrate is an insulator, an image charge Q' having a polarity opposite to that of the charge Q is induced in an opposed position which is determined depending on the dielectric constant of the substrate.

The strength of gathered electric field E1OC is figured out by the following formula (6), where R expresses a curvature radius of the tip of nozzle.

$$E_{loc} = \frac{V_0}{kR} \quad (6)$$

In the formula, k expresses a proportionality constant which relies on the shape of nozzle and some other factors, k generally being about 1.5-8.5, often being about 5 (P. J. Birdseye and D. A. Smith, Surface Science, 23(1970), p. 198-210). Further, here, the condition R=d/2 is set so as to make the structure of ink discharge model simple. This condition denotes a state that the conductive ink in the tip of nozzle is extruded in a hemispherical shape, whose curvature radius is equal to that of the nozzle diameter d, by the surface tension.

Here, to look at the balance of pressure applied to the discharge fluid in the tip of nozzle, the electrostatic pressure Pe is first found as follows, where S expresses the area of liquid in the tip of nozzle.

$$P_e = \frac{Q}{S} E_{loc} = \frac{2Q}{\pi d^2} E_{loc} \quad (7)$$

Then, assuming the condition: α=1 according to the formulas (5) through (7), the pressure Pe is further expressed as follows.

$$P_e = \frac{4\epsilon_0 V_0}{d} \cdot \frac{2V_0}{kd} = \frac{8\epsilon_0 V_0^2}{kd^2} \quad (8)$$

Meanwhile, the pressure Ps, which is caused by the surface tension of the discharge fluid in the tip of nozzle, is found as follows where γ expresses the surface tension.

$$P_s = \frac{4\gamma}{d} \quad (9)$$

To cause a fluid to be discharged, the electrostatic force needs to be greater than the surface tension, and therefore the relationship between the electrostatic pressure Pe and the pressure Ps by the surface tension is found as follows.

$$P_e > P_s \quad (10)$$

Figure 3:
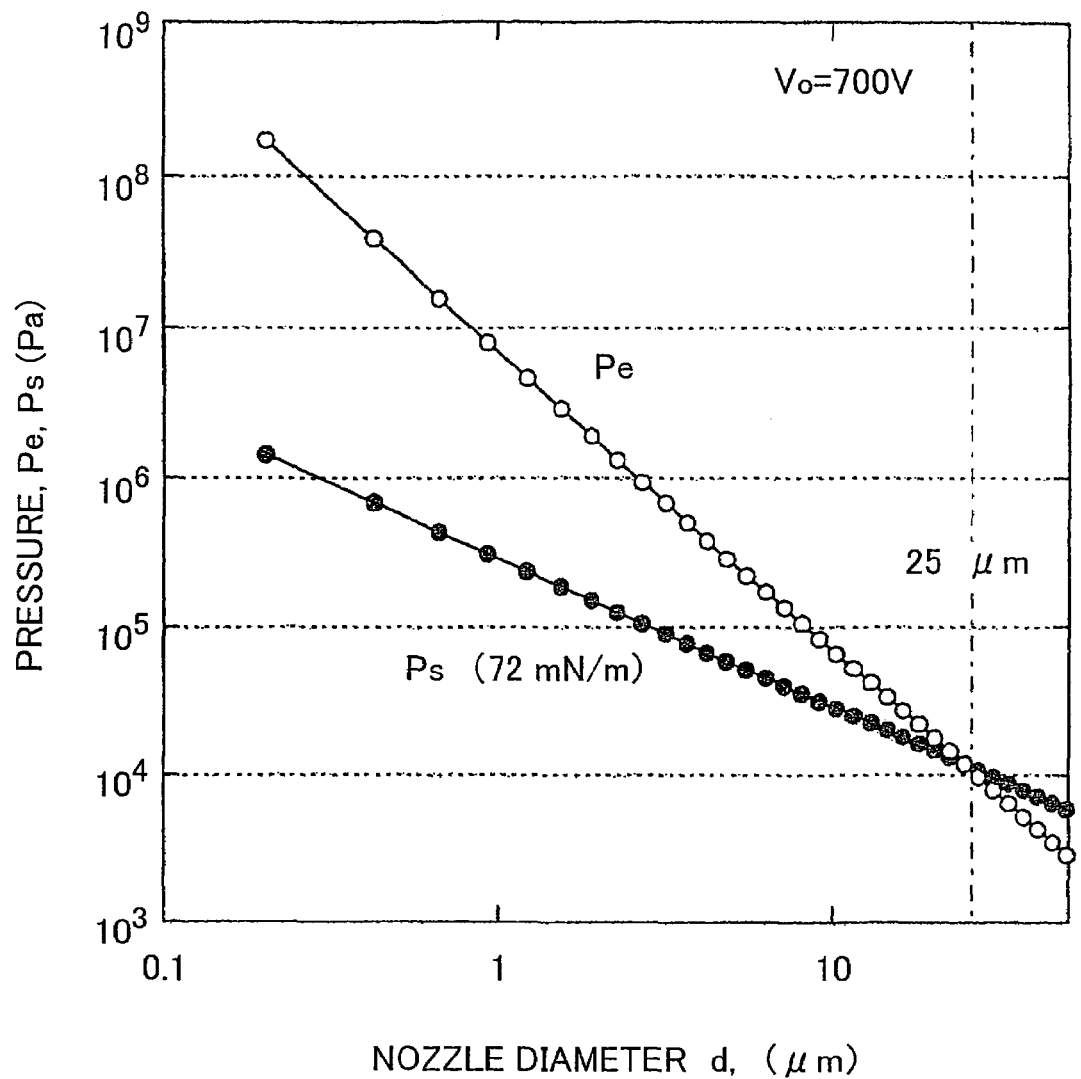
FIG. 3 is a graph showing the calculation result of a model of nozzle-diameter dependency of a surface tension pressure and an electrostatic pressure.

FIG. 3 shows a relationship between the electrostatic pressure Pe and the pressure Ps by the surface tension for a nozzle having a diameter=d. The surface tension is found by assuming that the fluid is water ($\gamma$=72 mN/m). On the stipulation that the voltage applied to the nozzle is 700V, the electrostatic pressure Ps appears to be greater than the pressure Ps by the surface tension when the nozzle diameter d is 25 μm. According to this, the following formula 11 denotes the relationship between V0 and d at the minimum voltage to cause the fluid to be discharged.

Further, the discharge pressure $\Delta P$ is given by the formula (12), and is finally given by the formula (13).

$$\Delta P = P_e - P_s \quad (12)$$

$$\Delta P = \frac{8\varepsilon_0 V_0^2}{kd^2} - \frac{4\gamma}{d} \quad (13)$$

Figure 4:
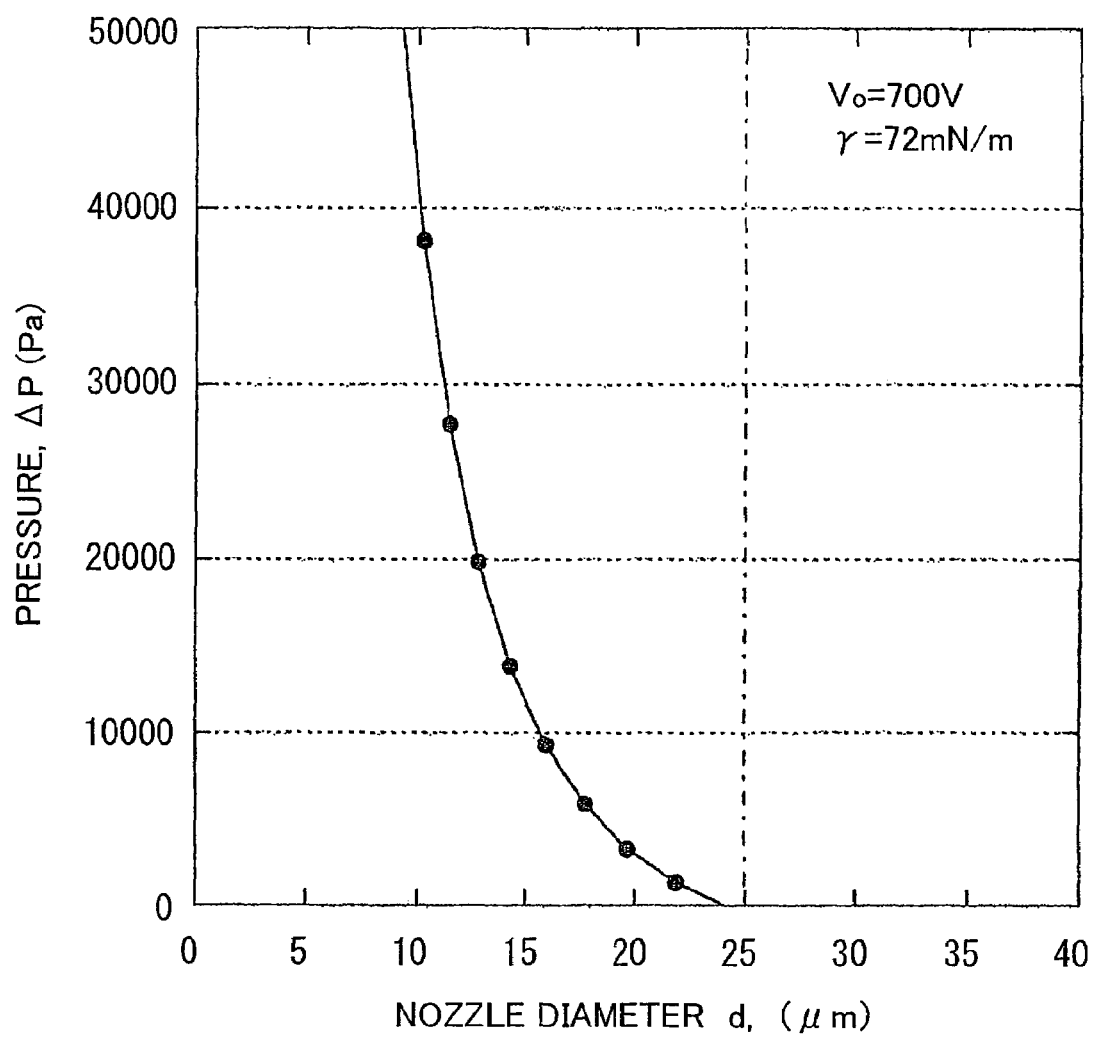
FIG. 4 is a graph showing the calculation result of a model of nozzle diameter dependency of a discharge pressure.
Figure 5:
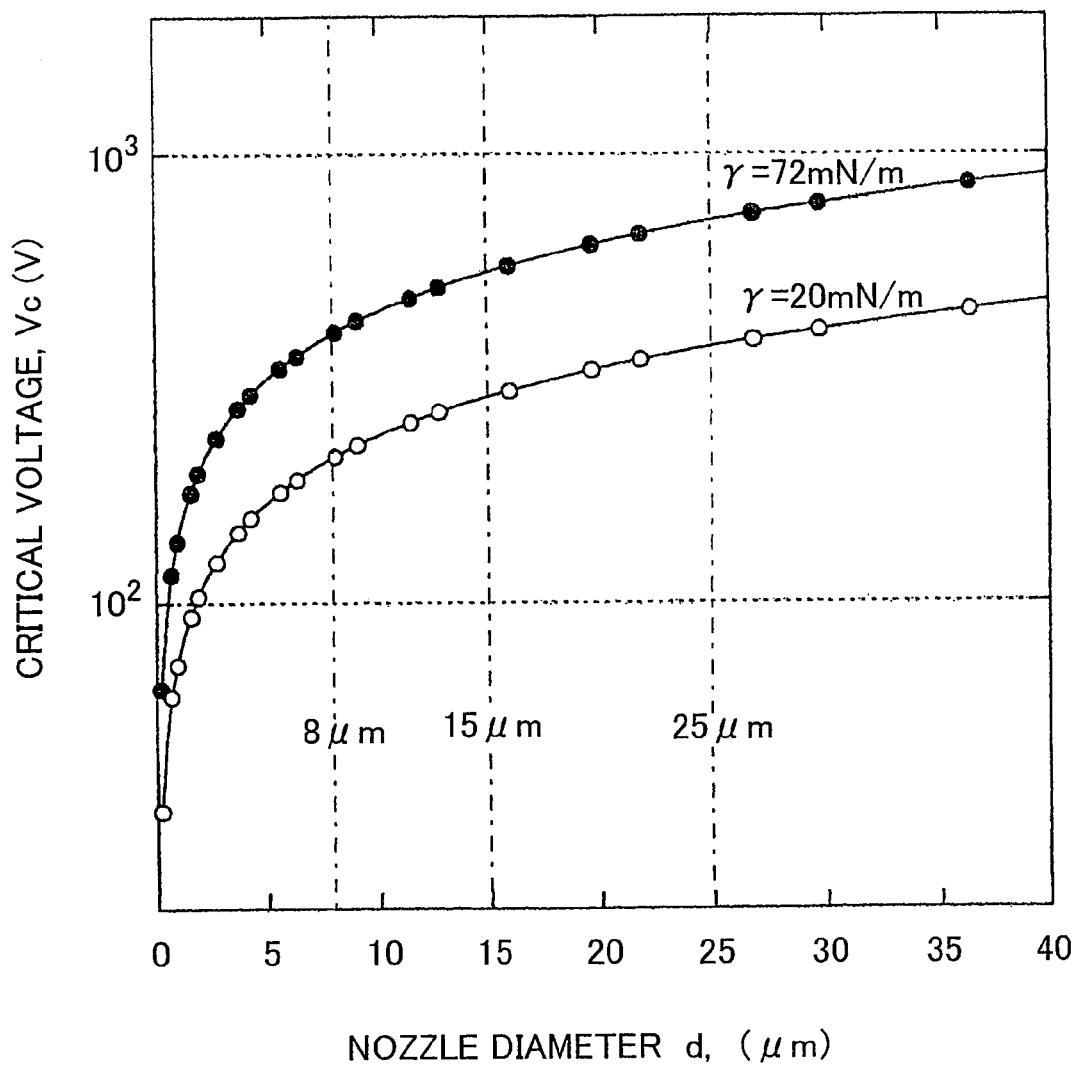
FIG. 5 is a graph showing the calculation result of a model of nozzle diameter dependency of a discharge limit voltage.

FIG. 4 shows a dependency of the discharge pressure $\Delta P$ when the condition to cause discharge in a nozzle having a diameter=d is met by a local field strength. FIG. 5 shows a dependency of critical discharge voltage (minimum voltage to cause discharge) Vc.

As can be seen in FIG. 4, if the condition to cause discharge in a nozzle having a diameter=d is met by a local field strength (when the condition: V0=700V, $\gamma$=72 mN/m is assumed), the upper limit of the nozzle diameter is 25 μm.

In the calculation in FIG. 5, the condition: K=5 was satisfied by assuming that the discharge fluid is water ($\gamma$=72 mN/m) and an organic solvent ($\gamma$=20 mN/m). In consideration of the effect that the micro nozzle causes an electric field to be converged, this figure clearly shows that the critical discharge voltage Vc decreases as the nozzle diameter decreases, and therefore the critical voltage Vc to discharge water is figured out as about 700V for a 25 μm nozzle.

In only the idea of electric field for the conventional discharge model, that is an electric field defined by the voltage V0 applied to the nozzle and the distance h between the nozzle and the opposing electrode, is taken into account; the drive voltage to cause discharge increases as the diameter of nozzle becomes smaller.

However, in the discharge model of the present presupposed technology using a local field for which the local field strength is also taken into account, the drive voltage for discharge can be reduced by a microscopic size nozzle. Such reduction in drive voltage offers a great advantage to miniaturize the device and to realize high-density nozzle. Besides, decreasing the drive voltage also enables use of a low voltage drier which appreciably helps cost reduction.

Moreover, in the discharge model using the local field, the electric field strength required for discharge depends on the converged local electric field strength, and therefore the opposing electrode can be omitted. More specifically, in a conventional discharge model, an electric field is applied between the nozzle and the substrate, and therefore it was necessary to either provide an opposing electrode on the other side of nozzle when using an insulating substrate, or use a conducting substrate. Further, in forming the opposing electrode, that is, when the substrate is an insulator, the thickness of the substrate was limited.

Figure 6:
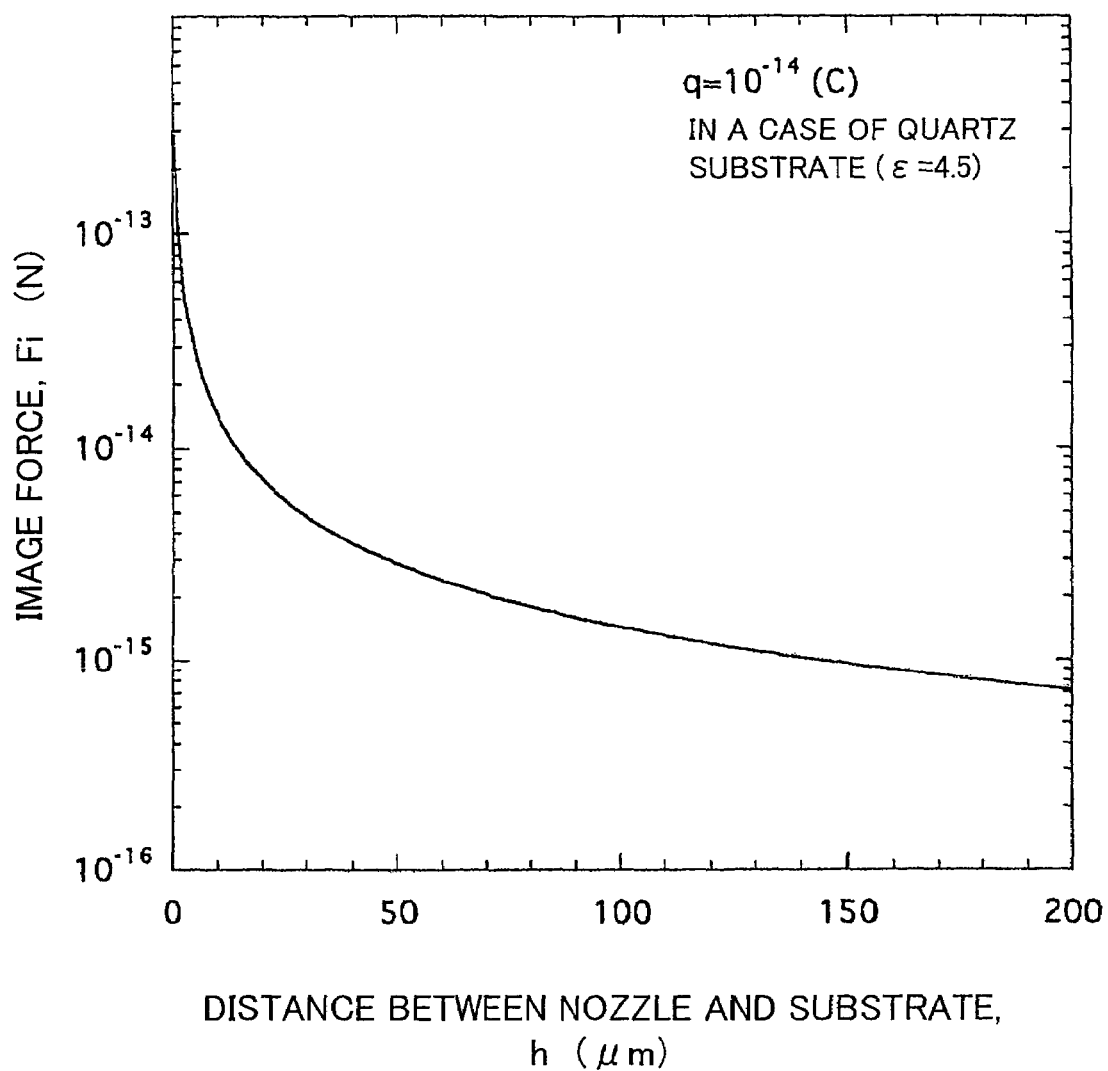
FIG. 6 relates to a technology as a presupposition of the present invention, and is a graph showing a correlation between (i) an image force exerted to a space between an electrically charged droplet and a substrate and (ii) the distance between a nozzle and the substrate.

On the other hand, the discharge model of the presupposed technology is capable of printing on an insulating substrate without using an opposing electrode, allowing more flexible device arrangement. Further, it is capable of printing on a thick insulator. Further, since the fluid discharged from the nozzle is electrically charged, an image force is generated between the fluid and the substrate. FIG. 6 shows a correlation between the magnitude of the image force and the distance h of nozzle from the substrate.

Next, the following assumption is made to find a way of precisely controlling the discharge flow rate. For a viscid fluid, the flow rate Q in a cylinder path is denoted by the following Hagen Poiseuille Formula. When a cylinder nozzle is used, the flow rate Q in the nozzle is expressed as follows.

$$Q = \frac{\pi \Delta P}{\eta L} d^4 \quad (14)$$

In the formula, $\eta$ expresses a viscosity coefficient (Pa·s), L expresses a length (m) of flow path (nozzle), d expresses a diameter (m) of flow path (nozzle), and $\Delta P$ expresses a pressure difference (Pa). The foregoing formula indicates that the flow rate Q is proportional to the fourth power of the radius of flow path, meaning that the flow rate can be effectively controlled by using a micro nozzle. The value found by formula (13) is used in the formula (14), and the following formula (15) is obtained.

$$Q = \frac{4\pi d^3}{\eta L}\left(\frac{2\varepsilon_0 V_0^2}{kd} - \gamma\right) \quad (15)$$

Figure 7:
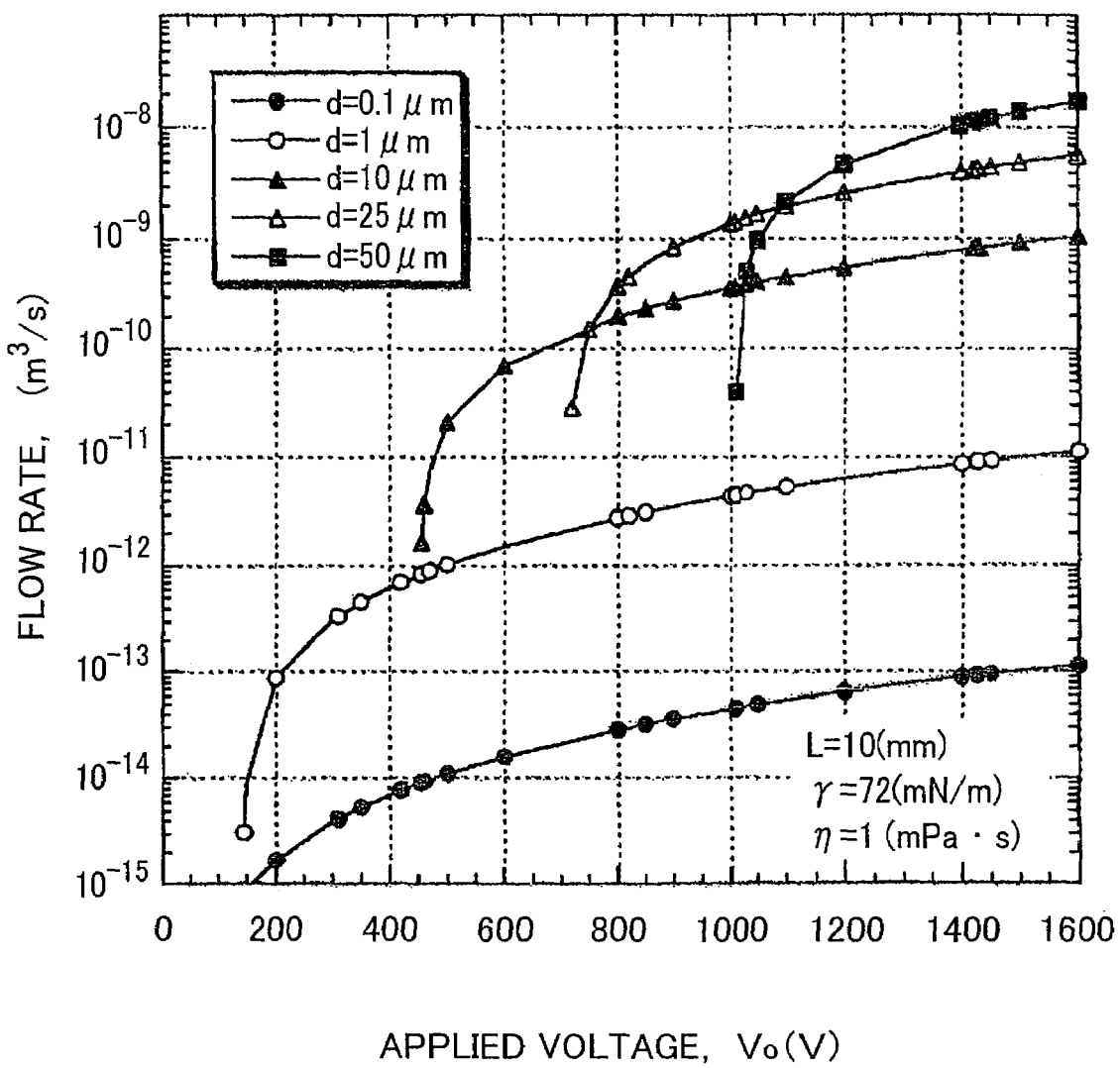
FIG. 7 relates to the presupposed technology the present invention, and is a graph showing the calculation result of a model of a correlation between an applied voltage and the rate of flow of the discharge from the nozzle.

The formula (15) is to find an amount of fluid flowing out of a nozzle having a length=L and a diameter=d, when a voltage V is applied to the nozzle. FIG. 7 shows this state. The amount is calculated on condition that: L=10 mm, $\eta$=1 (mPa·s), $\gamma$=72 (mN/m). In this case, the diameter of nozzle is assumed to be 5 μm, the minimum diameter among the conventional nozzles. The voltage V is gradually applied, and the fluid is started to be discharged at 1000V, which corresponds to the discharge-start voltage mentioned in FIG. 5. The Y axis denotes the flow rate of fluid from the nozzle. The flow rate jumps right after the discharge-start voltage Vc. According to this model calculation, a micro flow rate appears to be obtained by precisely setting the voltage to a value slightly above Vc. However, as can be seen in the semilog diagram, it is not possible in actual operation, particularly for an amount below $10^{-10}$ m$^3$/s. Moreover, as explained above with formula (11), a minimum driving voltage for a nozzle having a certain diameter is automatically determined. Therefore, discharge of fluid less than $10^{-10}$ m$^3$/s, or application of voltage less than 1000V is not practically realistic as long as the nozzle diameter is at least 50 μm as in the conventional art.

As can be seen in the diagram, a nozzle having a diameter=25 μm can be easily driven by a voltage of 700V or even less than that, and if the diameter is only 10 μm, it can be controlled by a voltage less than 500V. Further, a nozzle of 1 μm in diameter can be driven by a voltage less than 300V.

The foregoing theory was presented with an assumption that the fluid is discharged as a continuous flow. The following explains why a switching operation is required to form dots.

The discharge by electrostatic sucking is based on charging of fluid in the tip of nozzle. The charging speed is estimated at around the time constant, which depends on the dielectric relaxation.

$$\tau = \frac{\varepsilon}{\sigma} \quad (16)$$

In the formula, $\varepsilon$ expresses relative dielectric constant, and $\sigma$ expresses conductivity of fluid (S/m). Assuming that the relative dielectric constant is 10, and the conductivity is $10^{-6}$ S/m, a condition: $\tau = 1.854 \times 10^{-5}$ sec is found. Further, if the critical frequency is denoted by fc, the formula (17) is given.

$$f_c = \frac{\sigma}{\varepsilon} \quad (17)$$

Accordingly, it is not possible to follow a change in electric field at a frequency higher than fc, that is, the discharge does not occur. On this stipulation, a frequency of about 10 kHz is estimated for the case above.

Next, the following takes up a decrease of surface tension in the nozzle. Assuming a droplet of fluid discharged on an insulator placed on an electrode, the contact area of the fluid and the insulator can be increased by applying a voltage between the fluid and the electrode, in other words, the voltage application improves wettability. This phenomenon is known as Electrowetting. This effect also works for a cylindrical capillary, in which case it is often called Electrocapillary. The relation among (i) pressure due to Electrowetting, (ii) applied voltage, (iii) shape of capillary, and (iv) physicality rate of solvent is denoted by the formula (18) below.

$$P_{ec} = \frac{2\varepsilon_0 \varepsilon_r}{t} \frac{V_0^2}{d} \quad (18)$$

In the formula, $\varepsilon_0$ expresses dielectric constant in a vacuum, $\varepsilon_r$ expresses dielectric constant of insulator, t expresses thickness of insulator, and d expresses internal diameter of capillary. Adopting this formula with an assumption that the fluid is water, the case described in "Example" of the foregoing Patent Document 1 was examined, with a result of 30000 Pa (a pressure of 0.3 atmosphere), which is not so significant. On the other hand, the same examination was carried out for the presupposed technology with the result of about a pressure of 30 atmospheres when an electrode is provided outside the nozzle. With this effect, the fluid is quickly supplied to the tip of nozzle even in the case of micro nozzle. This effect becomes more significant as the dielectric constant of insulator increases, and as the thickness decreases. Strictly, the electrode needs to be placed on an insulator to obtain Electrocapillary; however, the effect can still be obtained as long as sufficient electric field is applied to a sufficient insulator.

However, it should be noted in presenting this approximate theory that the strength of electric field in this case denotes not the conventional sense of electric field which depends on the voltage V0 applied to the nozzle and the distance h between the nozzle and the opposing electrode, but a strength of converged local electric field in the tip of nozzle. Further, an important feature of the presupposed technology is the use of converged local electric field, and a fluid-supplying path having a significantly small conductance. Also, in the present invention, the fluid is sufficiently charged even in a unit of micro area. On this account, when a dielectric substance, such as a substrate, or an electric conductor approaches, the small amount of charged fluid is ejected at right angles with respect to the substrate due to the image force. Considering this structure, a grass capillary is used in the Embodiment below because of its simple fabrication; however, the present invention is not limited to this.

As described above, the electrostatic suction type fluid discharge device of the present embodiment is based on the discharge model that has been newly proposed in consideration of the local electric field strength. For this reason, it is possible to produce a micro nozzle with the nozzle diameter of 0.01 μm to 25 μm, and the discharge control of the discharge fluid can be carried out with a drive voltage of not more than 1000V. It is noted that, as a result of an assessment according to the model, it was found as follows: a nozzle with the diameter of not more than 25 μm was controllable with the drive voltage of not more than 700V; a nozzle with the diameter of not more than 10 μm was controllable with the drive voltage of not more than 500V; and a nozzle with the diameter of not more than 1 μm was controllable with the drive voltage of not more than 300V.

Figure 8:
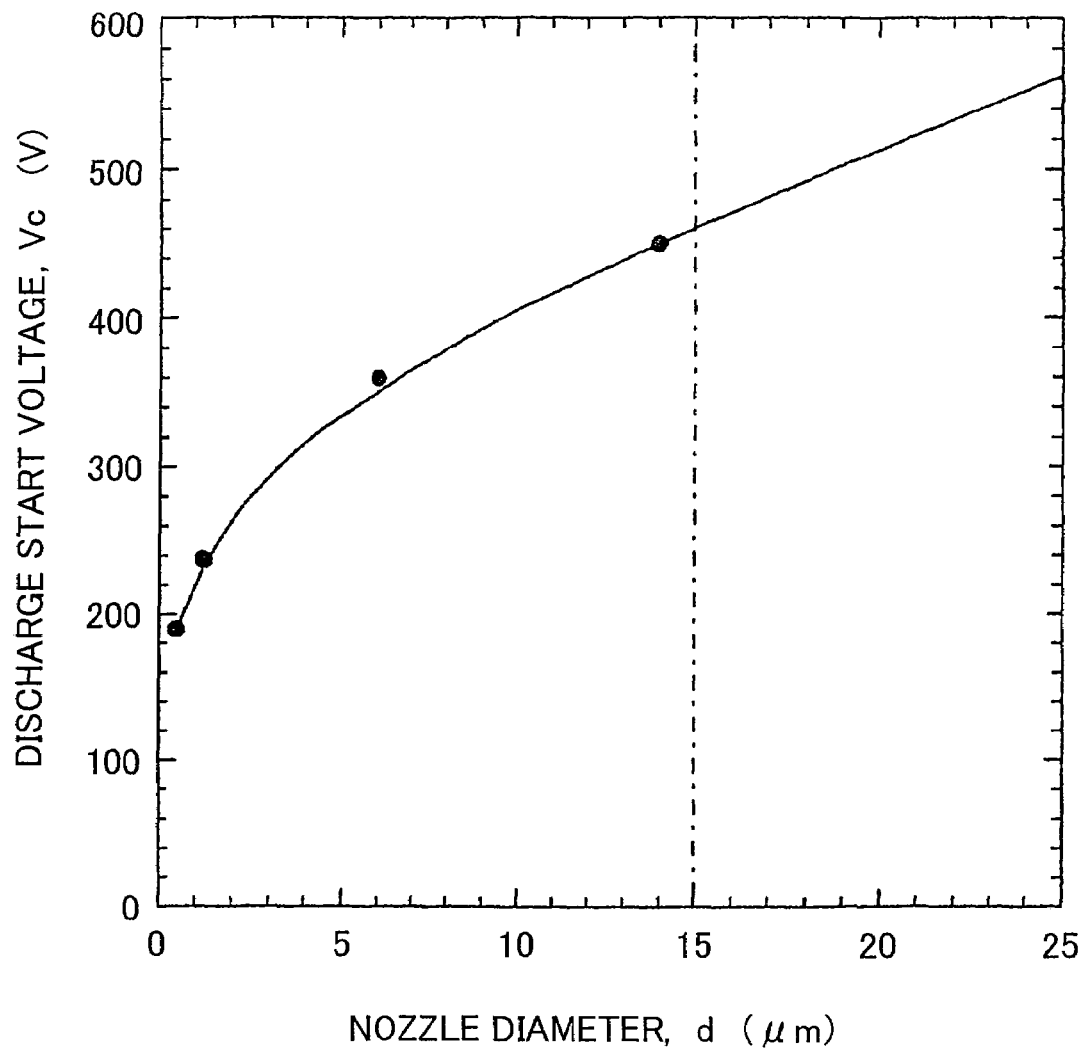
FIG. 8 is a graph showing the result of an experimental calculation of nozzle diameter dependency of a discharge-start voltage.

FIG. 8 shows the result of an experimentation of the nozzle diameter dependency of the critical discharge voltage Vc. In the experimentation, the discharge fluid was a silver nano-paste made by Harima Chemicals, Inc., and the distance between the nozzle and the substrate was 100 μm. According to FIG. 8, it is possible to understand that, the critical discharge voltage Vc decreases as the diameter of the nozzle decreases, and hence the discharge can be performed with a lower voltage than the voltage in the conventional arrangement.

As described above, in the electrostatic suction type fluid discharge device of the present embodiment, it is possible to reduce both the nozzle diameter and the drive voltage. As compared with the conventional electrostatic suction type fluid discharge device, however, the electrostatic suction type fluid discharge device has the following conspicuous problem.

Assume that the fluid discharge by the electrostatic suction type fluid discharge device is performed on an insulating substrate, and there is an electric charge adhered on the insulating substrate in the step before the fluid discharge. In such a case, it is difficult to stably form a minute pattern, because the minute pattern formed by the discharge is spoiled or a discharge error occurs, on account of electric field repulsion by the electric charge. For example, on a polymeric material whose surface resistance is about $10^{15}$ Ω/sq, e.g. polyimide and acryl, static electricity is easily generated by contact friction or the like. In a dry environment, static electricity is easily generated even on a glass substrate whose surface resistance is about $10^{10}$ Ω/sq.

Even in a case where there is no adhered electric charge on the insulating substrate, an electric charge exists in a discharge fluid landed on the insulating substrate. On this account, if the drive voltage is biased to one polarity, e.g. DC bias voltage and a mono-polarity pulse voltage, the insulating substrate is charged up by the electric charge in the discharge fluid. As a result, the surface potential on the insulating substrate increases. In other words, an electric charge is produced on the insulating substrate on account of the formation of the pattern on the substrate by the discharge fluid, and the discharge characteristics deteriorate due to the electric field repulsion force of the electric charge.

In reality, in a case where the pattern of the discharge fluid is formed on the insulating substrate and the substrate is electrically charged to some degree, a discharge minimum voltage on polyimide with the surface resistance of $10^{15}$ Ω/sq is higher than the discharge minimum voltage on a glass or conductive SUS substrate, whose surface resistance is $10^{10}$ Ω/sq, as shown in Table. 1. In this manner, the discharge characteristic are deteriorated. It is noted that Table. 1 shows the results in a case where the nozzle diameter is 1 μm.

TABLE 1

| TYPE OF SUBSTRATE | DISCHARGE MINIMUM VOLTAGE |
| --- | --- |
| POLYIMIDE ($10^{15}$Ω/sq) | 330 V |
| GLASS ($10^{10}$Ω/sq) | 148 V |
| SUS | 148 V |

According to the electrostatic suction type fluid discharge device of the present embodiment, the increase in the surface electric potential on account of the electric charge adherence on the insulating substrate is restrained, so that the discharge of a minute fluid is always stably performed and hence a clear minute pattern is formed. The following will describe embodiments of such an electrostatic suction type fluid discharge device.

Embodiment 1

As described in the presupposed technology, the electrostatic suction type fluid discharge device is arranged such that, the reduction of the diameter of the nozzle hole and the reduction of the drive voltage are both achieved by causing the diameter (nozzle diameter) of the nozzle hole to fall in the range of ϕ0.01 to 25 μm.

An amount of discharged liquid, which is discharged from the nozzle, can be controlled by changing (i) the electric potential difference between the nozzle and a discharge target and (ii) the distance between the nozzle and the discharge target, i.e. the gap. Basically, the field strength at the tip of the nozzle is increased as the potential difference is increased, or as the gap is shortened. In this manner, an amount of discharged liquid is easily controlled.

However, the electrostatic suction type fluid discharge method is accompanied by the aforesaid problem of the charge-up of the substrate. That is, to discharge a liquid to an insulating discharge target, if the drive voltage applied to the nozzle is biased to plus or minus, e.g. DC bias voltage or mono-polarity pulse voltage, the discharge target is charged up on account of the electric charge of the discharged liquid, and the surface potential of the discharge target increases. This increase in the surface potential destabilizes the potential difference between (i) the nozzle (drive electrode in the nozzle) by which the discharge is performed and (ii) the discharge target. A discharge error occurs for this reason.

Because of the above, for stable discharge by using a mono-polarity bias voltage, it is necessary to further increase the bias voltage applied to the drive electrode of the nozzle (i.e. increase the discharge minimum voltage), to secure the aforesaid potential difference. This makes it difficult to drive the nozzle with a low voltage.

To restrain the increase in the discharge minimum voltage, it is preferable to use a bipolar pulse voltage as the drive voltage of the nozzle. In such a case, as shown in Table. 2 below, the discharge minimum voltage decreases as compared to a case where a DC bias voltage is used. This is because, the charge of the droplets landed on the discharge target alternately changes between positive and negative, and the polarity of an electric charge of the droplet dropped on the discharge target is opposite to the polarity of the electric charge of the previously-dropped droplet. In this manner, the discharge is carried out while the charge-up of the discharge target is restrained. Therefore, using the bipolar pulse voltage as the drive voltage of the nozzle is effective for improving the stability of the discharge from the nozzle.

TABLE 2

| VOLTAGE APPLICATION METHOD | DISCHARGE MINIMUM VOLTAGE |
| --- | --- |
| DC | 330 V |
| BIPOLAR PULSE VOLTAGE | 163 V |

Figure 9:
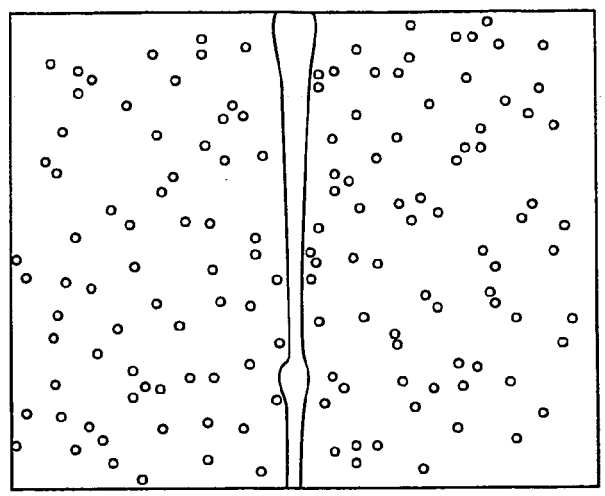
FIG. 9 illustrates a state where minute droplets scatter around a drawing pattern, at the time of forming the drawing pattern using, as a drive voltage of the nozzle, a bipolar pulse voltage.
Figure 10:
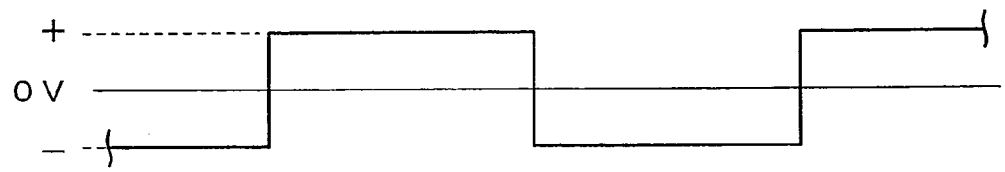
FIG. 10($a$) is a waveform chart showing an example of a low-frequency pulse voltage as a drive voltage of the nozzle.
Figure 10:
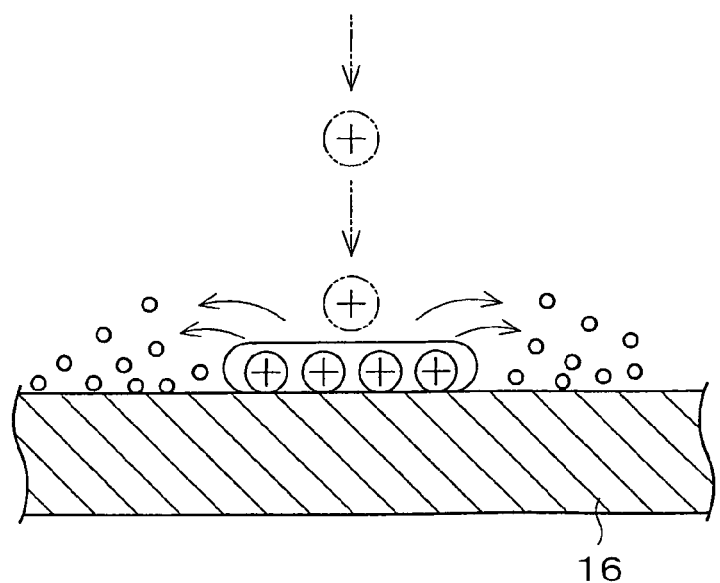

However, even if the bipolar pulse voltage is used as the drive voltage of the nozzle, as shown in FIG. 9, minute droplets scatter around the drawing pattern at the time of forming the drawing pattern on the discharge target, and the drawing pattern loses shape. This occurs on account of the following reason.

For example, as shown in FIG. 30(a), in a case where the drive voltage of the nozzle is a pulse voltage with a low frequency and the discharge from the nozzle is carried out by positive pulses of the pulse voltage, liquid droplets with a positive potential are serially discharged onto an insulating substrate 16 which is the discharge target. As shown in FIG. 30(b), a droplet is dropped onto the previously-dropped droplet, and these droplets repel each other on the insulating substrate 16 because the droplets are charged in the same polarity. For this reason, for example, the latter droplet is broken up into smaller droplets and the smaller droplets scatter on the insulating substrate 16.

The scatter of the smaller droplets has an adverse effect on the electric characteristics of the substrate, in a case where, for example, a wiring pattern is formed on the insulating substrate 16 by using a conductive material as the discharge material.

For this reason, the electrostatic suction type fluid discharge device of the present invention is arranged in such a manner that, in a case where a bipolar pulse voltage is used as the drive voltage of the nozzle, the scatter of the discharge material on the discharge target is restrained and hence a clear minute pattern with little disturbance in a drawn image is formed.

The following will specifically describe the electrostatic suction type fluid discharge device of the present embodiment.

Figure 1:
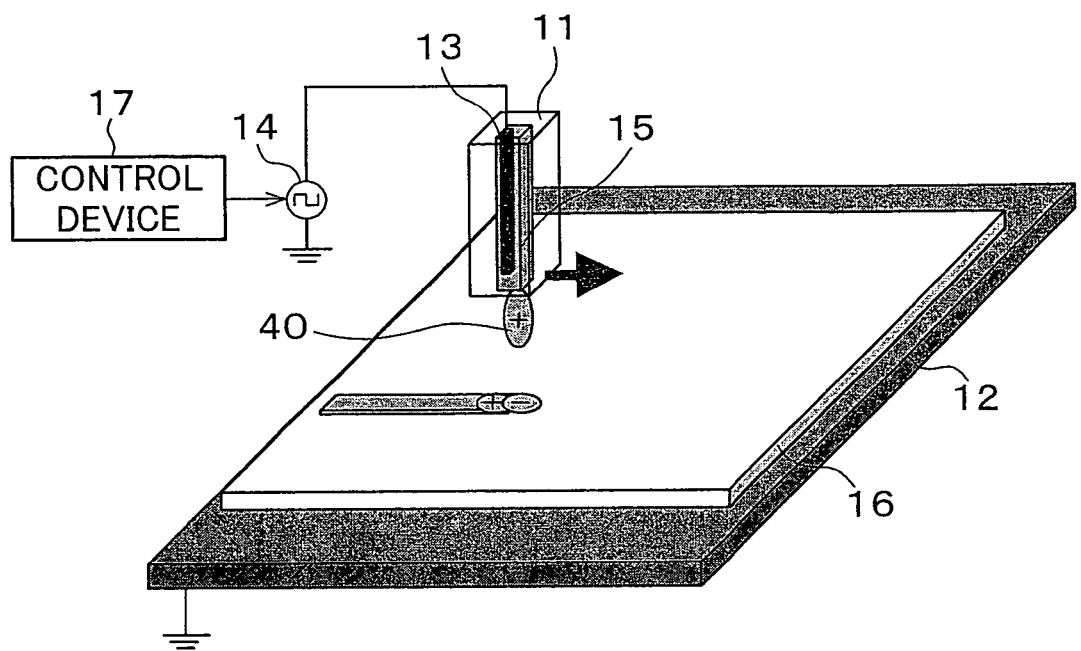
FIG. 1 outlines an electrostatic suction type fluid discharge device of an embodiment of the present invention.

FIG. 1 outlines the electrostatic suction type fluid discharge device of the present embodiment. As shown in the figure, in the electrostatic suction type fluid discharge device, a nozzle 11 that functions as a droplet discharge head opposes to a stage 12. That is to say, the nozzle 11 is provided so that the tip thereof faces downward, and the stage 12 is horizontally provided below the nozzle 11. The nozzle 11 is driven by a drive device (not illustrated), so as to be capable of moving toward an optional direction. For example, the nozzle 11 is attached to a 3-dimensional robot that independently moves the nozzle 11. The nozzle 11 and the stage 12 are moved in a relative manner. Thus, the stage 12 may be driven by a drive device and moved.

In the nozzle 11, a drive electrode 13 is provided. This drive electrode 13 is connected to a power source (drive voltage supply means) 14. Also, the nozzle 11 is filled with a discharge material (fluid) 15 that is a liquid. On the stage 12, an insulating substrate (discharge target) 16 is fixed. The insulating substrate 16 is the target of the discharge of the discharge material 15. The stage 12 is connected to ground, and hence the insulating substrate 16 is also connected to ground through the intermediary of the stage 12. On the insulating substrate 16, for example, a minute wiring pattern is formed by the discharge material 15 discharged from the nozzle 11.

To discharge hyperfine droplets of the fluid, the nozzle 11 is arranged such that a low-conductance path is provided in the vicinity of the nozzle 11 or the nozzle 11 has a low conductance. On this account, the nozzle 11 is preferably a capillary made of glass. Alternatively, the nozzle 11 may be arranged such that a conductive material is coated with an insulating material.

The nozzle 11 is preferably made of glass, because of, for example, the following reasons: a nozzle hole which is about several μm in size is easily formed; if the nozzle hole is blocked, a new nozzle tip can be formed by braking the blocked nozzle tip; since the glass nozzle is tapered, an unnecessary solution moves upward on account of surface tension, and hence the solution does not remain at the nozzle tip so as not to induce the blocking of the nozzle; since the nozzle 11 has suitable elasticity, a movable nozzle can be easily formed.

More specifically, a glass tube with the core (product name: GD-1, made by Narishige Co., Ltd.) is used, and the nozzle can be formed by capillary puller. The use of the glass tube with the core is advantageous for the following reasons.

(1) Since a glass on the core side is easily wettable with the ink, the ink is easily filled up. (2) The glass on the core side is hydrophilic while the glass on the outer side is hydrophobic. For this reason, at the peripheral part of the nozzle, the ink exists only around the inside diameter of the glass on the core side, so that the concentration of the electric field is conspicuous. (3) the diameter of the nozzle can be reduced. (4) A sufficient mechanical strength is obtained.

The lower limit of the nozzle diameter is preferably 0.01 μm in consideration of the manufacturing. The upper limit of the nozzle diameter is preferably 25 μm, because the upper limit of the nozzle diameter in a case where the electrostatic force shown in FIG. 3 exceeds the surface tension is 25 mm, and also the upper limit of the nozzle diameter, in a case where the discharge conditions are met on account of the local electric field strength shown in FIG. 4, is 25 μm. More preferably, the upper limit of the nozzle diameter is 15 μm. In particular, to effectively utilize the effect of local electric field concentration, the nozzle diameter preferably falls within the range between 0.01 μm and 8 μm. In the present embodiment, the nozzle diameter falls within the range between φ0.1 μm and φ20 μm.

The nozzle 11 is not necessarily a capillary tube. The nozzle 11 may be a 2-dimension-pattern nozzle formed by micro-fabrication. In a case where the nozzle is made of a glass with good formability, it is not possible to use the nozzle 11 as an electrode. On this account, into the nozzle 11, a metal wire (e.g. tungsten wire) is inserted as a drive electrode 13. Alternatively, the drive electrode 13 may be formed in the nozzle 11 by plating. In a case where the nozzle 11 is made of a conductive material, the nozzle 11 is externally coated with an insulating material.

The drive electrode 13 is provided in such a way as to be dipped in the discharge material 15 that fills the nozzle 11. The discharge material 15 is supplied from a supply source (not illustrated).

Figure 11:
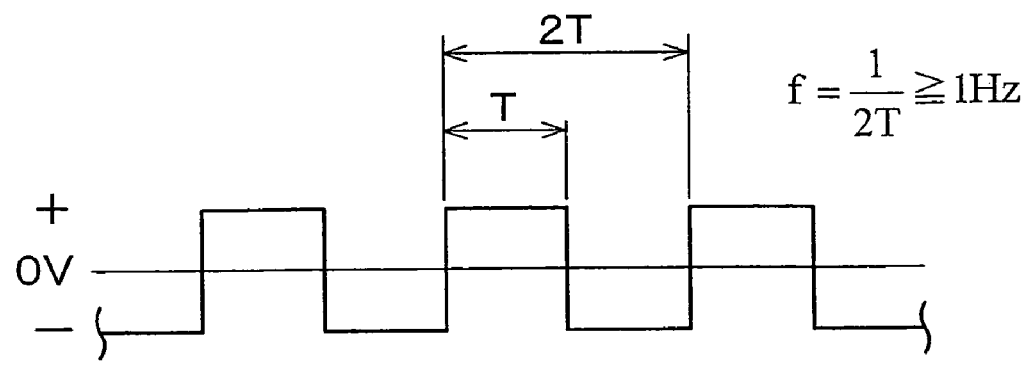
FIG. 11 is a waveform chart showing an example of a drive voltage supplied from a power source shown in FIG. 1.

The power source (drive voltage supply means) 14 is controlled by a control device (drive voltage supply means) 17 which includes, for example, a computer. That is to say, a discharge signal is supplied from the control device 17 to the power source 14. In response to this discharge signal, a voltage with a pulsed waveform is supplied to the drive electrode 13. The discharge material 15 in the nozzle 11 is electrically charged by the supplied voltage, and is discharged through the nozzle 11. FIG. 11 shows an example of the drive voltage. This drive voltage is a bipolar pulse voltage whose polarity alternately inverts. The drive voltage has a frequency of not less than 1 Hz.

The insulating substrate 16 can be made of any materials on condition that the surface resistance is not less than $10^{10}$ Ω/sq. Apart from polymeric materials such as polyimide, acryl, and polycarbonate, a material made of glass or the like formed in a low humidity circumstance may be used as the material.

On the premise of the arrangement above, the following will discuss how minute droplets of the liquid is discharged from the nozzle 11. The discharge is performed as follows: in the electrostatic suction type fluid discharge device, the drive voltage is supplied from the power source 14 to the drive electrode 13, so that the drive electrode 13 supplies an electric charge to the discharge material 15. Via the discharge material 15 in the nozzle 11, the electric charge moves to a meniscus 40 that is formed on the tip of the nozzle 11 and has an electrostatic capacity. Once an amount of the electric charge in the electrostatic suction type fluid discharge device 40 reaches a predetermined amount, the liquid is discharged from the nozzle 11 to the insulating substrate 16.

Now, the following describes a case where the nozzle 11 of the electrostatic suction type fluid discharge device discharges the discharge material 15 and a desired pattern is formed on the insulating substrate 16.

The nozzle 11 is moved in a 2-dimensional manner in the X-axis direction and in the Y-axis direction, in line with desired patterning data. The nozzle 11 is driven by a drive device such as a 3-dimensional robot. On this occasion, the position of the nozzle 11 in the Z-axis direction is controlled in such a manner that the distance (gap) between the tip of the nozzle 11 and the insulating substrate 16 always falls within the range between 30 μm and 200 μm. As the gap measuring means, a displacement gauge using a laser or a gap measuring instrument using a laser is used.

As a result of the movement of the nozzle 11, the power source 14 supplies the bipolar pulse voltage (drive voltage) to the drive electrode 13 of the nozzle 11. With this, in the discharge material 15 in the nozzle 11, the electric charge starts to move towards the tip of the nozzle 11. At the tip of the nozzle 11, the electric charge is accumulated in the meniscus 40 formed by the discharge material 15, so that an electric field strength in the vicinity of the tip increases. Subsequently, once the electric field strength exceeds the critical point for the discharge of the discharge material 15 from the nozzle 11, the nozzle 11 discharges the discharge material 15, and the droplets of the discharge material 15 land on the insulating substrate 16. In this case, since the drive electrode 13 receives, as the drive voltage of the nozzle 11, a bipolar pulse voltage of 1 Hz or higher, the polarity of the droplets of the liquid landed on the insulating substrate 16 alternates. For discharging one droplet, a time of 500 msec or less is required.

The following will describe the frequency characteristics of the bipolar pulse voltage at the time of image drawing on the insulating substrate 16 in the electrostatic suction type fluid discharge device.

Figure 12:
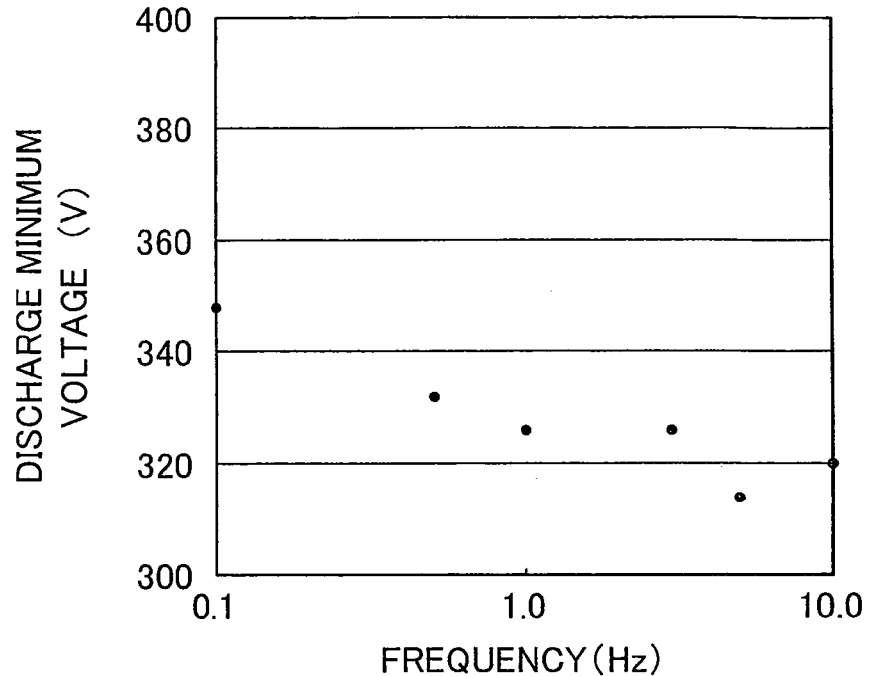
FIG. 12 is a graph showing the relationship between a discharge minimum voltage and a drive voltage frequency of the nozzle, in the electrostatic suction type fluid discharge device shown in FIG. 1.
Figure 13:
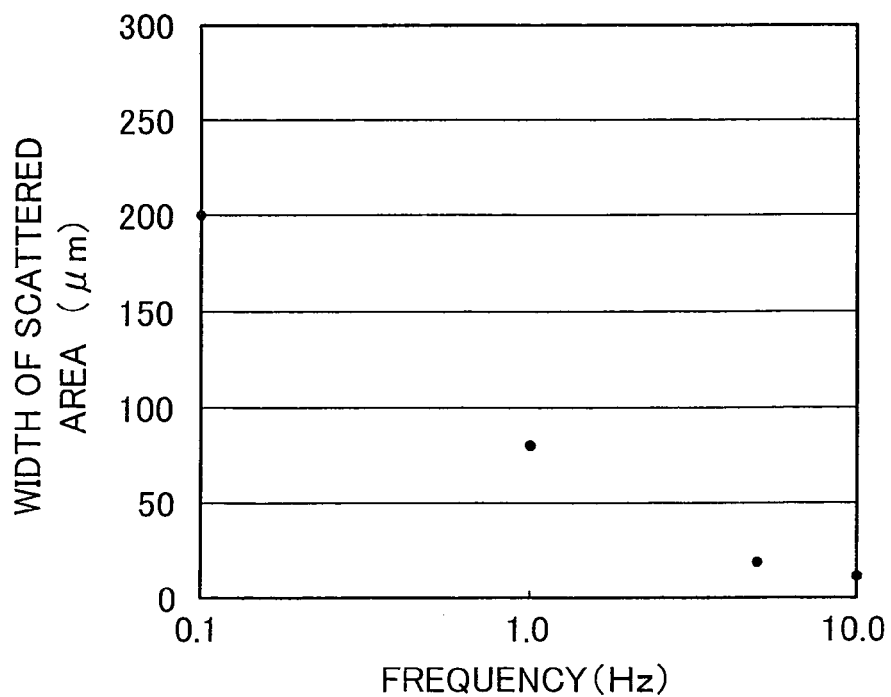
FIG. 13 is a graph showing the relationship between (i) a drive voltage frequency of the nozzle at the time of drawing a line and (ii) the width of an area where droplets scatter on the insulating substrate, in the electrostatic suction type fluid discharge device shown in FIG. 1.

FIG. 12 shows the relationship between a drive voltage frequency and a discharge minimum voltage, in a case where, as the discharge material, a silver nano paste is discharged onto a polyimide substrate (insulating substrate 16). FIG. 13 shows the relationship between (i) the drive voltage frequency and (ii) the width of an area where the droplets scatter on the insulating substrate 16, at the time of drawing a line.

As the bipolar pulse voltage which is the drive voltage is supplied to the drive electrode 13, the nozzle 11 discharges droplets of the discharge material 15, in accordance with alternately-applied positive and negative voltages. The time required for the discharge changes in accordance with the frequency of the bipolar pulse voltage. In proportion to this discharge time, an amount of electric charge of one droplet of the discharge material 15, which lands on the insulating substrate 16, changes.

In this case, as an amount of electric charge of one droplet (discharged at a time) is increased by decreasing the frequency of the bipolar pulse voltage, the discharge minimum voltage (discharge-start voltage from the nozzle 11) increases as shown in FIG. 12. This is because, as an amount of electric charge for one droplet increases, an amount of electric charge of the droplet landed on the insulating substrate 16 increases (i.e. a charge amount of the insulating substrate 16 increases). The potential difference between the insulating substrate 16 and the nozzle 11 is therefore reduced, and this increases the voltage (drive voltage) applied to the drive electrode 13, which voltage is required to persistently and steadily perform the discharge.

That is, in FIG. 12, the discharge minimum voltage (discharge-start voltage) starts to increase when the drive voltage frequency becomes less than 1 Hz. In this manner, in a case where the drive voltage frequency is less than 1 Hz, the discharge from the nozzle 11 starts to be influenced by the charge-up of the insulating substrate 16, as in a case where the drive voltage is a DC bias voltage (DC voltage).

In reality, as shown in FIG. 12, it is possible to confirm that, the width of the area where the droplets scatter on the insulating substrate 16, at the time of discharging the discharge material onto the insulating substrate 16 in order to draw an image, suddenly increases when the drive voltage frequency becomes less than 1 Hz. On the contrary, when the drive voltage frequency is not less than 1 Hz, the width of the aforesaid area on the insulating substrate 16 is not more than 50 µm, and hence an image is suitably and steadily drawn.

As described above, the electrostatic suction type fluid discharge device of the present embodiment uses, as the drive voltage applied to the drive electrode 13 of the nozzle 11, a bipolar pulse voltage of not less than 1 Hz. On this account, it is possible to restrain (i) the increase of the area where the droplets scatter on the insulating substrate 16 on account of the charge-up of the insulating substrate 16 and (ii) the increase of the drive voltage. As a result, the formation of a clear minute pattern on the insulating substrate 16 can be carried out by driving the nozzle 11 with a low voltage.

In the present embodiment, the bipolar pulse voltage as the drive voltage is supplied to the drive electrode 13 of the nozzle 11. The drive voltage required for the discharge from the nozzle 11 is a potential difference between the voltage applied to the drive electrode 13 and the voltage applied to the stage 12 functioning as the opposing electrode. On this account, the drive voltage may be applied only to the stage 12, or may be a voltage (potential difference) generated by synthesizing the voltage applied to the stage 12 with the voltage applied to the drive electrode 13.

The bipolar pulse voltage as the drive voltage may have a waveform with a low slew rate, e.g. AC voltage.

Embodiment 2

The following will describe another embodiment of the present invention, in reference to figures.

Figure 14:
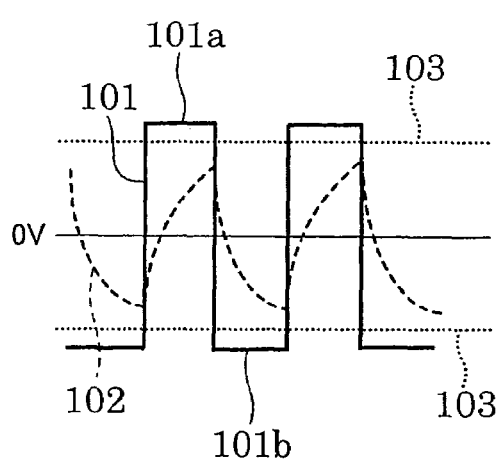
FIGS. 14($a$) and 14($b$) are waveform charts showing the relationship between (i) a waveform of a bipolar pulse voltage as a drive voltage, which is applied to a drive electrode of a nozzle and (ii) a surface electric potential of a discharge material at the tip of the nozzle, in an electrostatic suction type fluid discharge device of another embodiment of the present invention.
Figure 14:
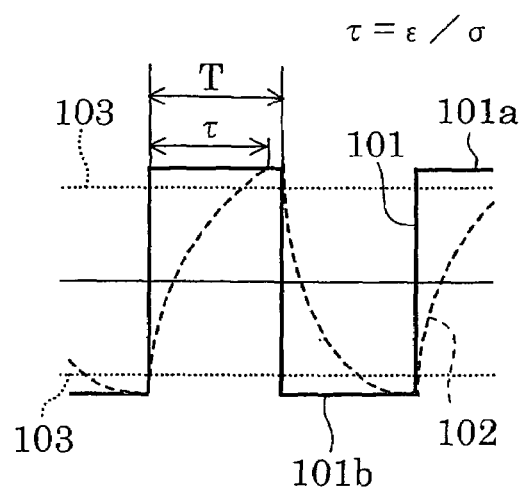
Figure 15:
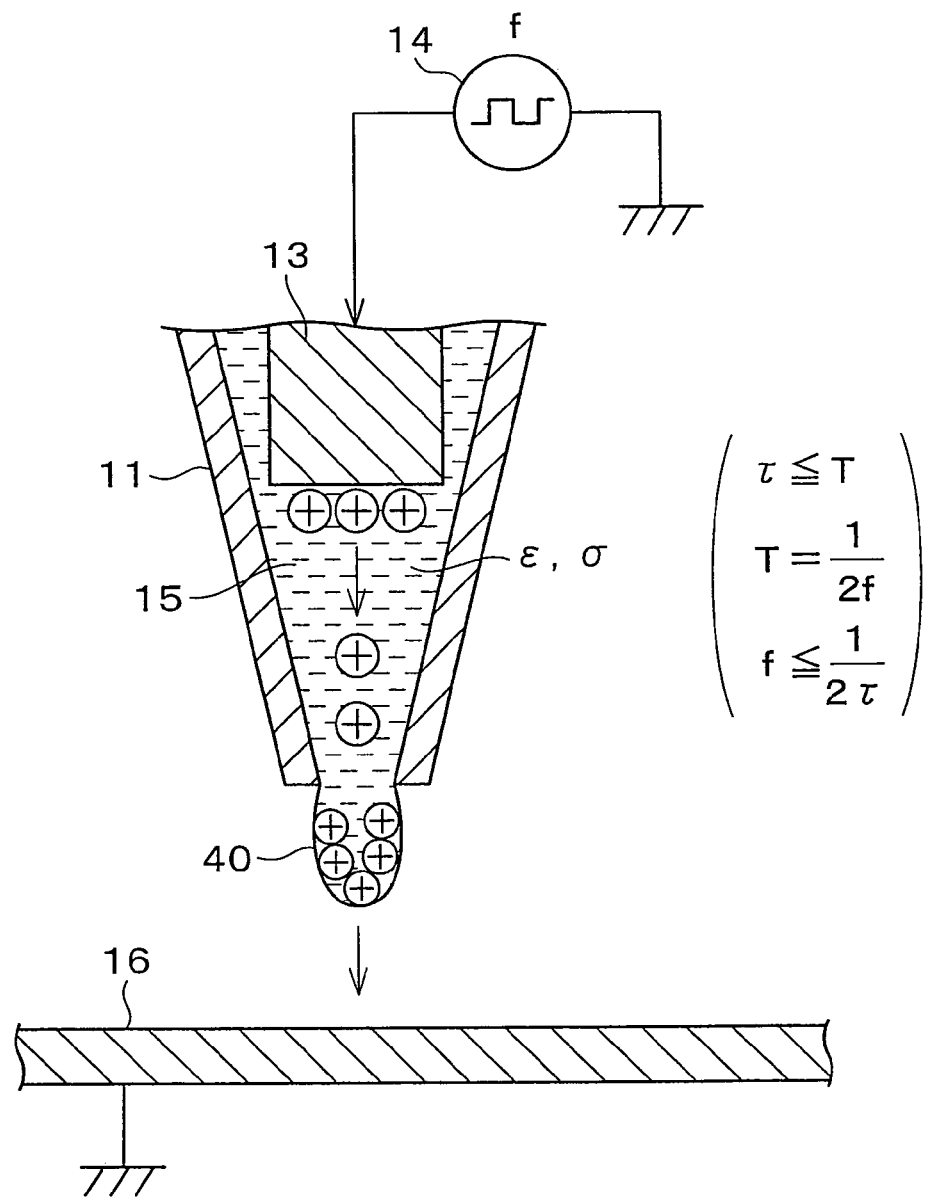
FIG. 15 illustrates, in the nozzle of the electrostatic suction type fluid discharge device of FIG. 1, how an electric charge supplied from the drive electrode is accumulated in a meniscus at the tip of the nozzle.
Figure 16:
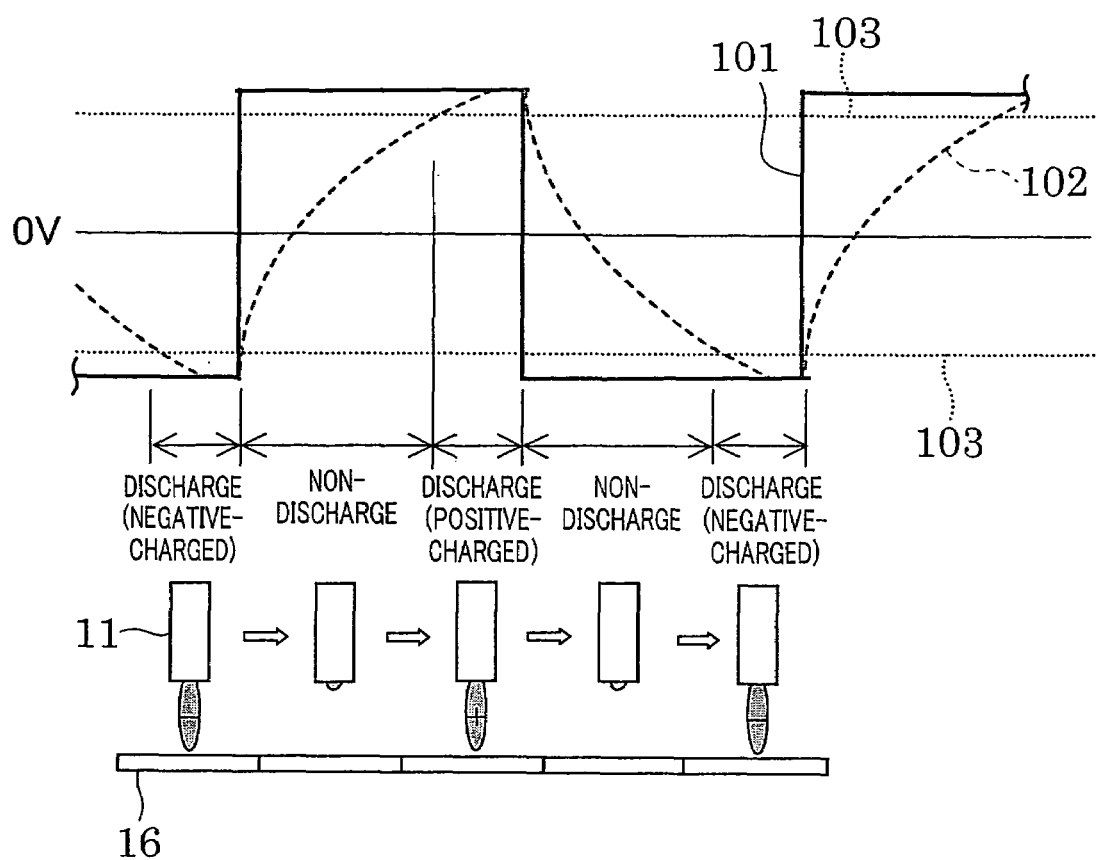
FIG. 16 illustrates how the discharge material is discharged and not discharged from the nozzle, in a case where the drive voltage shown in FIG. 14($b$) is applied.
Figure 17:
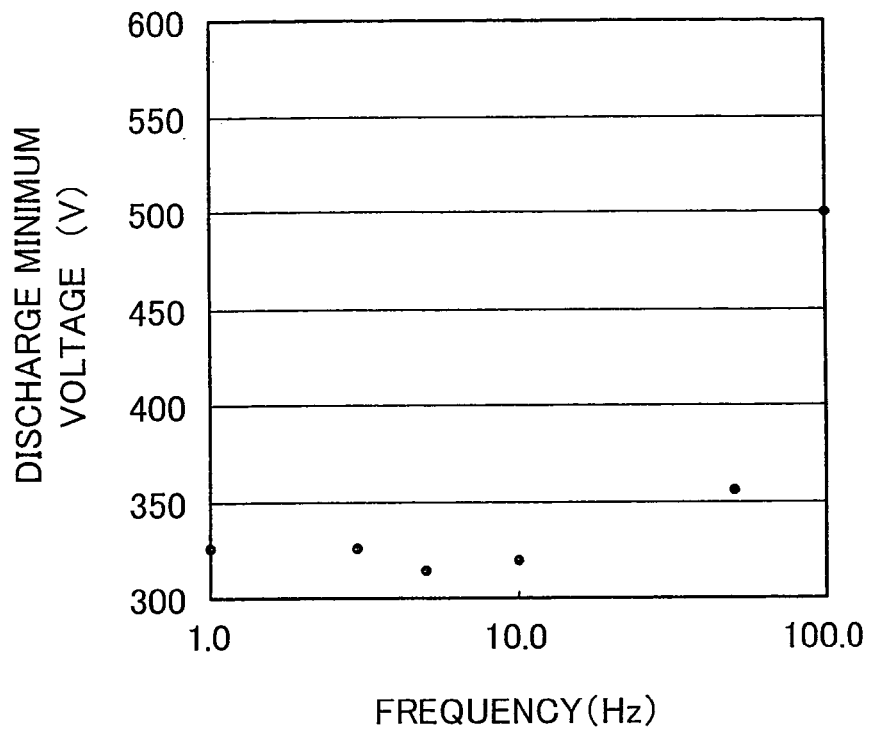
FIG. 17 is a graph showing the relationship between the drive voltage frequency and the discharge minimum voltage in the electrostatic suction type fluid discharge device shown in FIG. 1.
Figure 18:
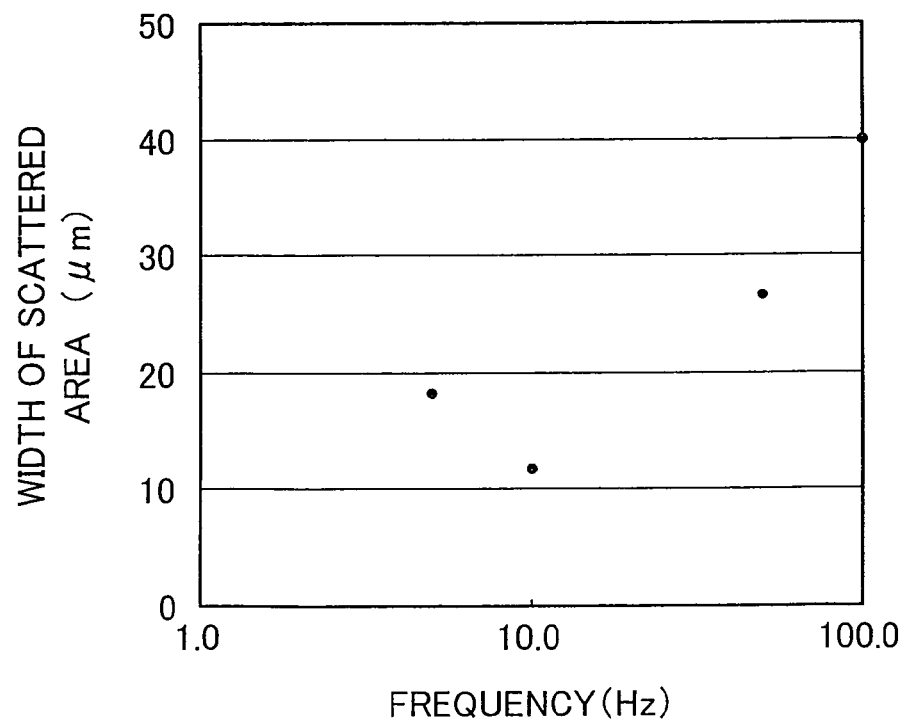
FIG. 18 is a graph showing the relationship between the drive voltage frequency and the width of an area where droplets scatter on the insulating substrate, in the electrostatic suction type fluid discharge device shown in FIG. 1.
Figure 19:
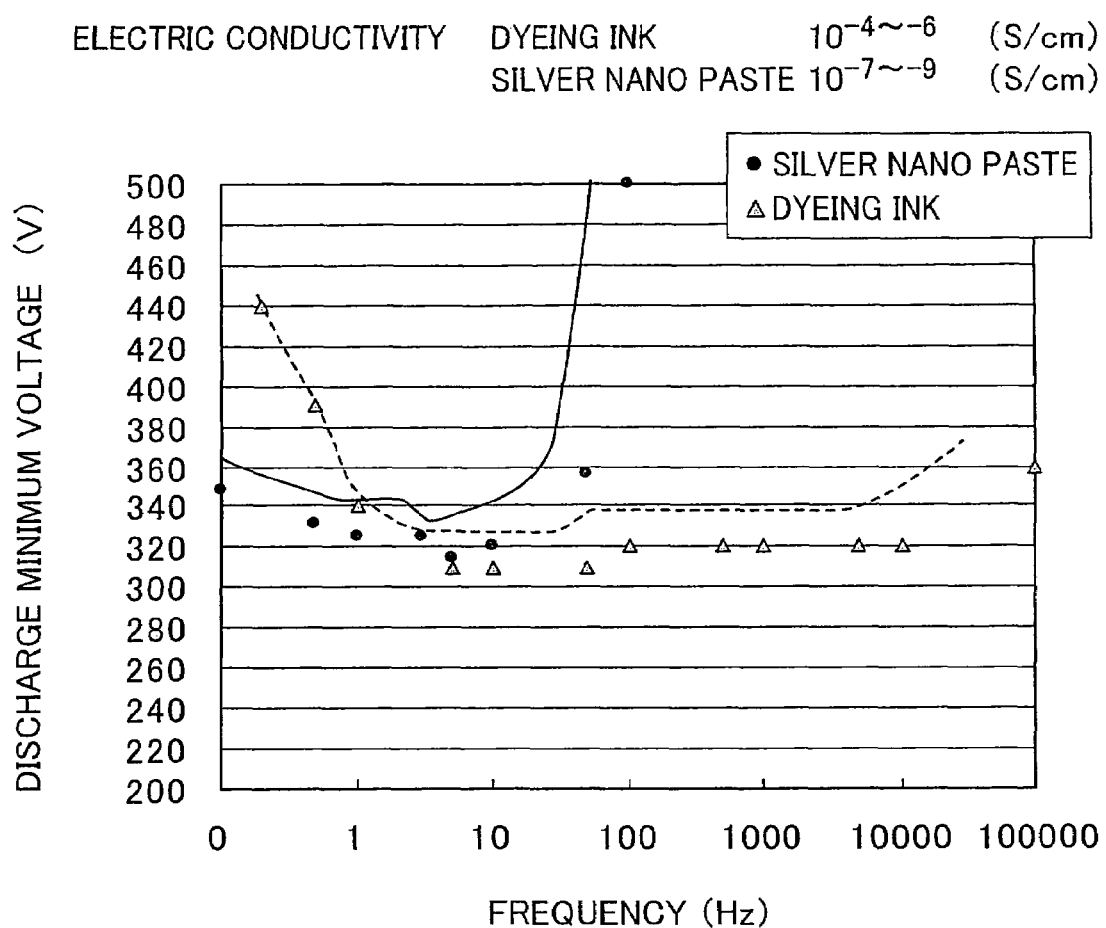
FIG. 19 is a graph showing, in a broad frequency range, the relationship between the drive voltage frequency and the discharge minimum voltage, in a case where the electrostatic suction type fluid discharge device of FIG. 1 adopts dyeing ink and silver nano-paste as the discharge materials.

FIGS. 14(a) and 14(b) are waveform charts showing the relationship between (i) the waveform of the bipolar pulse voltage which is the drive voltage applied to the drive electrode 13 of the nozzle 11 and (ii) the surface potential of the discharge material 15 at the tip of the nozzle 11. FIG. 14(a) shows a case where the nozzle 11 does not discharge the discharge material 15, whereas FIG. 14(b) shows a case where the nozzle 11 discharges the material 15. FIG. 15 illustrates how the electric charge supplied from the drive electrode 13 to the nozzle 11 is accumulated in the meniscus 40 at the tip of the nozzle 11. FIG. 16 illustrates how the discharge material 15 is discharged or not discharged from the nozzle 11, in a case where the drive voltage (drive voltage frequency) shown in FIG. 14(b) is used. FIG. 17 is a graph showing the relationship between the drive voltage frequency and the discharge minimum voltage. FIG. 18 shows the relationship between the drive voltage frequency and the width of the area where the droplets scatter on the insulating substrate 16. FIG. 19 is a graph in a wide frequency range, showing the relationship between (i) the respective drive voltage frequencies when dyeing ink and silver nano-paste are used as the discharge materials 15 and (ii) the discharge minimum voltage. In the present embodiment, descriptions on those identical with the previous embodiment are omitted, and only the differences are described.

The electrostatic suction type fluid discharge device of the present embodiment is arranged as shown in FIG. 1. In regard of this electrostatic suction type fluid discharge device, FIG. 14(a) or 14(b) shows the relationship between (i) the voltage waveform in a case where the drive electrode 13 of the nozzle 11 receives a bipolar pulse voltage and (ii) the surface potential on account of the electric charge accumulated in the discharge material 15 at the tip of the nozzle 11, which charge is accumulated because of the application of the voltage of (i).

That is, in FIGS. 14(a), 14(b), and 15, when the bipolar pulse voltage 101 is applied to the drive electrode 13 of the nozzle 11, the electric charge moves in the discharge material 15 from the drive electrode 13 in the nozzle 11 towards the tip of the nozzle, and the electric charge is accumulated in the meniscus 40 at the tip of the nozzle 11. With this, a meniscus surface potential 102 increases in line with a saturation curve that reaches the maximum at a rise electric potential 101a and a fall electric potential 101b. In this case, the nozzle 11 starts to discharge the discharge material 15, when the meniscus surface potential 102 reaches a minimum-required electric potential 103 which is the minimum-required electric potential for obtaining the driving force required for the discharge.

Therefore, if, as shown in FIG. 14(a), the drive voltage frequency is arranged such that the pulse inversion occurs (reverse-polarity voltage is applied) before the meniscus surface electric potential 102 reaches the minimum-required electric potential 103, the nozzle 11 does not discharge the discharge material 15. On this account, to cause the nozzle 11 to discharge the discharge material 15, it is necessary to elongate a time for applying the positive or negative voltage of the bipolar voltage 101, by either increasing the amplitude of the bipolar pulse voltage 101 or decreasing the drive voltage frequency.

In a case of decreasing the drive voltage frequency, whether or not the nozzle 11 performs the discharge is determined by the magnitude relation between (i) a charge time constant τ determined by the electric conductivity σS/m and the relative permittivity $\in$ of the discharge material 15 and (ii) the time T for applying each of the positive and negative voltages of the bipolar pulse voltage 101. On this account, as shown in FIG. 14(b), it is possible to cause the nozzle 11 to discharge the discharge material 15, by setting the drive voltage frequency fHz in such a manner as to allow the time T to be larger than the charge time constant τ, i.e. by setting the drive voltage frequency f in such a manner as to satisfy $f \leq 1/(2\tau)$. FIG. 16 shows that the discharge material 15 is discharged or not discharged from the nozzle 11, in accordance with the drive voltage (drive voltage frequency) shown in FIG. 14(b).

The following illustrates a specific example where a silver nano paste as the discharge material 15 is discharged onto a polyimide substrate (insulating substrate 16). In relation to this case, FIG. 17 shows the relationship between the drive voltage frequency and the discharge minimum voltage, and FIG. 18 shows the relationship between the drive voltage frequency and the width of the area where the droplets scatter on the insulating substrate 16.

According to the result shown in FIG. 17, the discharge minimum voltage increases when the drive voltage frequency becomes not less than about 50 Hz. This indicates that, in this drive voltage frequency conditions, it is necessary to apply a high voltage (bipolar pulse voltage) to allow the meniscus surface potential 102 to reach the minimum-required electric potential 103. In other words, if the drive voltage frequency is not less than 50 Hz, $f \leq 1/(2\tau)$ is not satisfied.

According to the result shown in FIG. 18, the area where the droplets scatter on the insulating substrate 16 increases in size when the drive voltage frequency becomes not less than 50 Hz, and an image drawn on the insulating substrate 16 is greatly obscured. This proves that the discharge must be performed with the drive voltage frequency of not more than 50 Hz, to obtain a clear minute pattern by restraining the scatter of the droplets on the insulating substrate 16 as much as possible.

FIG. 19 shows, in a wide frequency range, the relationship between the drive voltage frequency and the discharge minimum voltage, in a case where the discharge material 15 is dyeing ink with an electric conductivity of $10^{-4}$ to $10^{-6}$ (S/cm) and silver nano paste with an electric conductivity of $10^{-7}$ to $10^{-9}$ (S/cm). That is, in FIG. 19, as to the silver nano paste, the example shown in FIG. 12 where the frequency is low is synthesized with the example shown in FIG. 17 where the frequency is high.

In the case of FIG. 19, a preferable range of the drive voltage frequency f is 1 Hz$\leq$f and $f \leq 1/(2\tau)$.

As described above, in the electrostatic suction type fluid discharge device of the present embodiment, the nozzle 11 is driven by, as the drive voltage, a bipolar pulse voltage whose drive voltage frequency f satisfies $f \leq 1/(2\tau)$. With this, the increase in the discharge minimum voltage is restrained, and the area where the droplets scatter on the insulating substrate 16 is reduced in size. It is therefore possible to form a clear minute pattern on the insulating substrate 16.

In the present embodiment, the bipolar pulse voltage as the drive voltage is applied to the drive electrode 13 of the nozzle 11. The drive voltage required for the discharge from the nozzle 11 is a potential difference between the voltage applied to the drive electrode 13 and the voltage applied to the stage 12 functioning as the opposing electrode. On this account, the drive voltage may be applied only to the stage 12, or may be a voltage (potential difference) generated by synthesizing the voltage applied to the stage 12 with the voltage applied to the drive electrode 13.

The bipolar pulse voltage as the drive voltage may have a waveform with a low slew rate, e.g. AC voltage.

Embodiment 3

The following will describe a further embodiment of the present invention in reference to figures.

Figure 20:
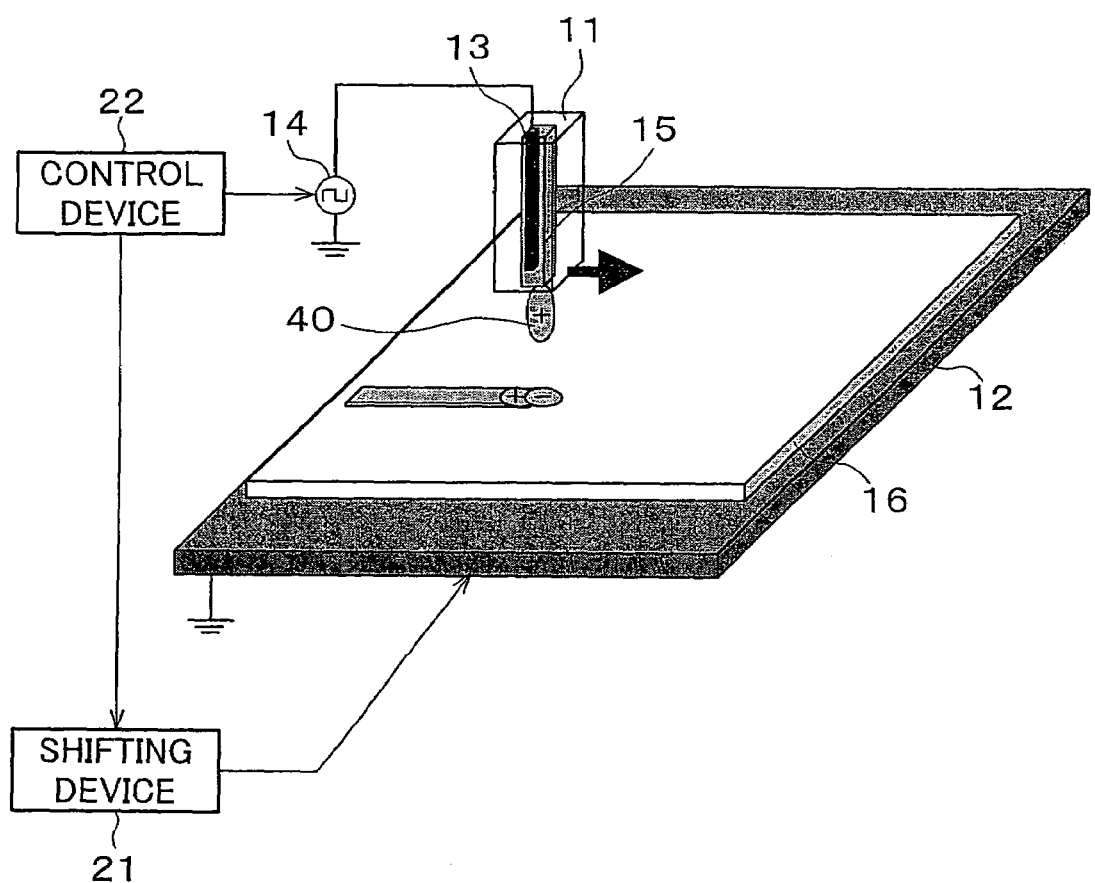
FIG. 20 outlines an electrostatic suction type fluid discharge device of a further embodiment of the present invention.

The electrostatic suction type fluid discharge device of the present embodiment is arranged as shown in FIG. 20. That is, in the electrostatic suction type fluid discharge device of the present embodiment, the stage 12 is driven by a shifting device (shifting means) 21 so as to be moved. A control device (control means) 22 controls the direction, speed, and timing of the movement by the shifting device 21. The control device 22 also controls (i) the drive voltage supplied from the power source 14 to the drive electrode 13 of the nozzle 11, (ii) the drive voltage frequency, (iii) when the drive voltage is applied, and the like.

Figure 21:
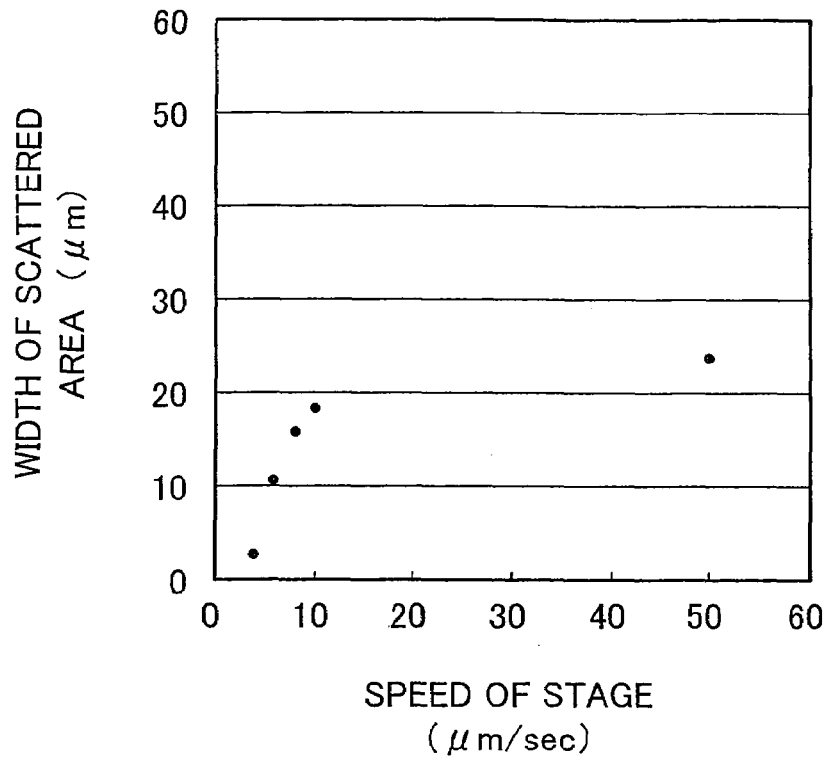
FIG. 21 is a graph showing the relationship between (i) a scanning speed of a stage and (ii) the width of an area where droplets scatter on an insulating substrate, in an electrostatic suction type fluid discharge device of yet another embodiment of the present invention.

FIG. 21 is a graph showing the relationship between the scanning speed of the stage 12 and the width of the area where the droplets scatter on the insulating substrate 16, in the electrostatic suction type fluid discharge device of the present embodiment. This figure shows the result of a discharge experimentation in which a line was drawn on a polyimide substrate (insulating substrate 16), using a silver nano paste as the discharge material 15. In the experimentation, the nozzle diameter was about 1 mm, and the drive voltage frequency was 50 Hz. As to the relative movement of the nozzle 11 and the insulating substrate 16 (stage 12), the stage 12 was moved.

According to the result in FIG. 21, when the scanning speed is not more than 10 μm/sec, the area where the droplets scatter on the insulating substrate 16 was very narrow. This is because, in connection with the discharge of the discharge material 15 from the nozzle 11, the width of the area where the droplets scatter on the insulating substrate 16 is influenced by an amount of displacement between (i) the dot (droplet) that has been landed on the insulating substrate 16 and (ii) the dot (droplet) to be landed next.

On this account, an ideal condition to minimize the area where the droplets scatter on the insulating substrate 16 is as follows: the discharge material 15 is discharged by alternately applying the positive and negative voltages of the bipolar pulse voltage, when the scanning speed is zero with respect to the insulating substrate 16, i.e. when the nozzle 11 is immediately above the droplet that has already been landed on the insulating substrate 16. In this ideal condition, an image drawing part (landed droplet part), whose resistance is lower than that of a peripheral insulated part (i.e. the surface of the insulating substrate 16) from which electricity is almost always removed (i.e. has 0V), is provided immediately below the nozzle 11. On this account, it is possible to restrain the charge-up in the landed position on the insulating substrate 16. Therefore, in the ideal condition, the increase in the discharge minimum voltage is restrained, and it is also possible to restrain, on the insulating substrate 16, the scatter of the droplets on account of those droplets having potentials with the same polarity and hence repelling each other.

On the other hand, in a case where the discharge of the discharge material 15 is carried out while the nozzle 11 and the insulating substrate 16 relatively move with respect to each other. As the scanning speed (relative speed) increases, the discharge position of the discharge material 15 discharged from the nozzle 11 is slightly displaced from the landing position of the immediately preceding discharge. In this case, since the discharge is carried out under the influence of both the electric potential on the insulating substrate 16 and the electric potential on the drawn line, the discharge is not stably performed, and the scatter of the discharge material 15 is liable to occur in the vicinity of the discharge position on the insulating substrate 16.

Concretely speaking, in the result shown in FIG. 21, in a condition where the scanning speed (stage speed) is 10 μm/sec and the drive frequency is 50 Hz, which are the critical points (if the scanning speed and the drive frequency exceeds these critical points, the width of the aforesaid area is widened), a droplet whose electric charge has a reverse polarity to the immediately preceding droplet lands at a position that is 0.1 µm away from the position where the immediately preceding droplet landed. That is to say, in general, provided that the drive voltage frequency is fHz and the discharge scanning speed is vµm/sec, the scatter of the droplets on the insulating substrate 16 is restrained when the dot pitch v/2f is not more than 0.1 µm. According to the result above, the relationship between the drive voltage frequency fHz of the bipolar pulse voltage and the discharge scanning speed vµm/sec is f≧5v, because v/2f≦0.1 µm.

The aforesaid condition is preferable in a case where the width of the drawn line and the diameter of the dot fall in the range between 1 µm and 10 µm.

As described above, in the electrostatic suction type fluid discharge device of the present embodiment, the drive voltage frequency fHz and the discharge scanning speed vµm/sec are set so as to satisfy f≧5v, in a case where a line is drawn by discharging minute droplets of the discharge material 15 onto the insulating substrate 16. With this, the scatter of the droplets on the insulating substrate 16 is restrained, and a clear minute pattern is formed.

In the present embodiment, the bipolar pulse voltage as the drive voltage is applied to the drive electrode 13 of the nozzle 11. The drive voltage required for the discharge from the nozzle 11 is equivalent to a potential difference between the voltage applied to the drive electrode 13 and the voltage applied to the stage 12 functioning as the opposing electrode. On this account, the drive voltage may be applied only to the stage 12, or may be a voltage (potential difference) generated by synthesizing the voltage applied to the stage 12 with the voltage applied to the drive electrode 13.

The bipolar pulse voltage as the drive voltage may have a waveform with a low slew rate, e.g. AC voltage.

In the present embodiment, the shifting device 21 moves the stage 12. However, since the stage 12 (insulating substrate 16) and the nozzle 11 are required to relatively move with respect to each other for the image drawing on the insulating substrate 16, the shifting device 21 may move at least one of the nozzle 11 and the stage 12.

Embodiment 4

The following will describe yet another embodiment of the present invention in reference to figures.

Figure 22:
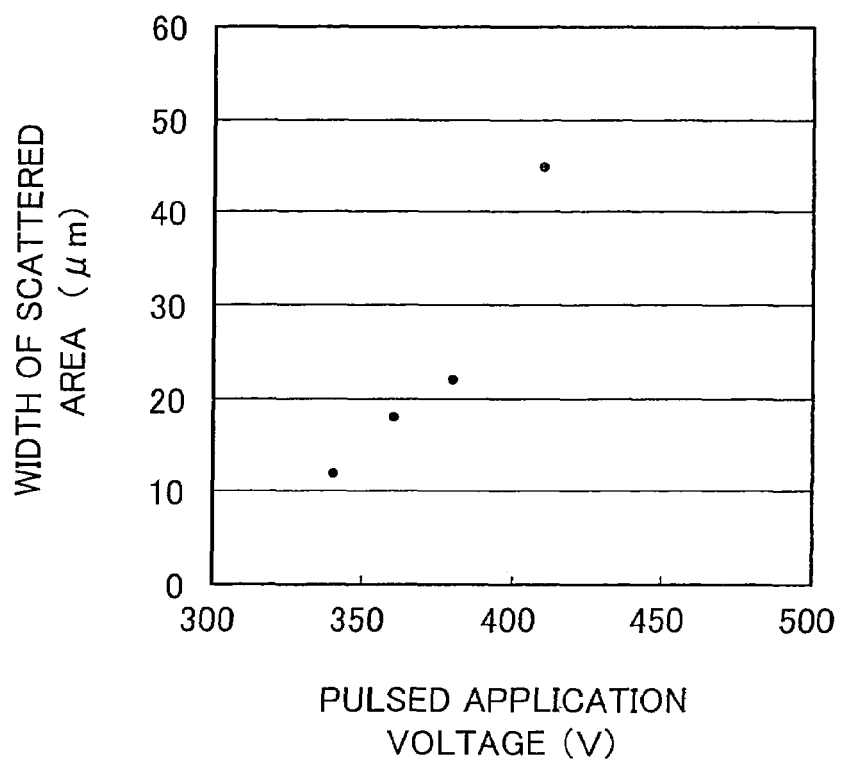
FIG. 22 is a graph showing the relationship between (i) a drive voltage applied to a drive electrode of a nozzle and (ii) an area where droplets scatter on an insulating substrate, in an electrostatic suction type fluid discharge device of still another embodiment of the present invention.

The electrostatic suction type fluid discharge device of the present embodiment is arranged as shown in FIG. 1. FIG. 22 is a graph showing the relationship between (i) the drive voltage (bipolar pulse voltage) applied to the drive electrode 13 of the nozzle 11 and (ii) the area where the droplets scatter on the insulating substrate 16, in the electrostatic suction type fluid discharge device of the present embodiment.

FIG. 22 shows the result of an experimentation in which a silver nano paste as the discharge material 15 was discharged onto a polyimide substrate (insulating substrate 16), so that an image was drawn. In this case, the nozzle diameter was about 1 µm, the drive voltage frequency was 50 Hz, and the speed of relative movement (scanning speed) between the nozzle 11 and the insulating substrate 16 (stage 12) was 200 µm/sec. The discharge was performed with the conditions above. In this case, the discharge pitch was 2 µm, and the diameter (landed droplet diameter) of the landed dot discharged from the nozzle that is 1 µm in diameter was about 1 µm. Therefore, formed by the landed droplets was not a line but dots.

According to the result shown in FIG. 22, as the drive voltage (pulsed application voltage) is increased, the width of the area where the droplets scatter on the insulating substrate 16 in association with the discharge of the discharge material 15 becomes sharply widened. This is because, a great amount of droplets having the electric potentials with the same polarity lands at an identical position. That is, as the drive voltage increases, an amount of the discharge material 15 discharged from the nozzle 11 increases. In the droplets landing on the insulating substrate 16, electric potentials having the same polarity repel each other, and hence the area where the droplets scatter increases. In particular, the scatter area rapidly increases as the drive voltage exceeds 400V. On the contrary, the scatter area is relatively narrow when the drive voltage is not more than 400V. This indicates that the discharge is performed while the scatter of the droplets to the neighboring parts is restrained, when the drive voltage is not more than 400V. Note that, in the aforesaid case, the lower limit of the drive voltage is identical with, for example, the discharge minimum voltage.

As described above, in the electrostatic suction type fluid discharge device of the present embodiment, the drive voltage applied to the drive electrode 13 of the nozzle 11 is not more than 400V, in a case where dots are formed by discharging minute droplets on the insulating substrate 16. On this account, on the insulating substrate 16, it is possible to restrain the scatter of the droplets to the vicinity of the landed dots (landed droplets), and hence a clear minute pattern is formed.

In the present embodiment, the bipolar pulse voltage as the drive voltage is applied to the drive electrode 13 of the nozzle 11. The drive voltage required for the discharge from the nozzle 11 is a potential difference between the voltage applied to the drive electrode 13 and the voltage applied to the stage 12 functioning as the opposing electrode. On this account, the drive voltage may be applied only to the stage 12, or may be a voltage (potential difference) generated by synthesizing the voltage applied to the stage 12 with the voltage applied to the drive electrode 13.

The bipolar pulse voltage as the drive voltage may have a waveform with a low slew rate, e.g. AC voltage.

Also, in the embodiment above, the width of the area where the droplets scatter is not strictly determined by the width of a line to be drawn. The width of the area indicates the width of the whole area where the droplets unnecessarily scatter, which includes the drawing pattern area and the both sides of the drawing pattern area.

Embodiment 5

Figure 23:
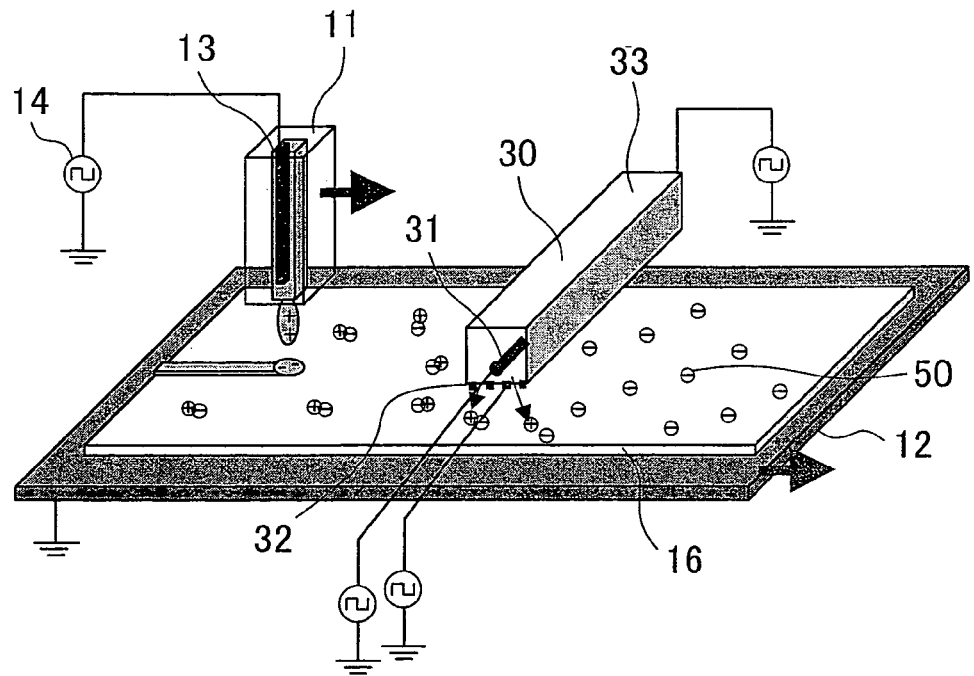
FIG. 23 is an oblique perspective view that outlines an electrostatic suction type fluid discharge device of Embodiment 5.

FIG. 23 shows the electrostatic suction type fluid discharge device of Embodiment 5. In this electrostatic suction type fluid discharge device, the insulating substrate 16 is fixed on the stage 12 which is grounded. The insulating substrate 16 is required to have a surface resistance of not less than $10^{10}$ Ω/sq. The material of the insulating substrate is therefore a polymeric material such as polyimide, acryl, and polycarbonate, a material made of glass or the like formed in a low humidity circumstance, or the like. In the electrostatic suction type fluid discharge device, furthermore, a corona charger 30 and a fluid discharge head (nozzle) 11 are provided so that the tips of the corona charger 30 and the fluid discharge head 11 oppose to the insulating substrate 16.

The corona charger 30 includes an electrode wire 31 and a slit electrode 32 which is horizontally provided and is closer to the insulating substrate 16 than the electrode wire 31. The corona charger 30 is further provided with a case electrode 33 that surrounds the electrode wire 31. The electrode wire 31 is made of nickel or tungsten, and about 10 to 70 µm in diameter. These electrodes are connected to a power source so that a voltage is individually applied to each electrode. The distance between the slit electrode 32 and the insulating substrate 16 is always kept consistent. The distance falls within the range of about 100 µm to 2 mm.

In the fluid discharge head 11, the diameter of the hole at the tip is φ0.1 to 20 µm. Also, the fluid discharge head 11 includes the drive electrode 13 therein. The drive electrode 13 is connected to a power source 14 used for individually supplying a bipolar pulse voltage and keeping the frequency of the bipolar pulse voltage at not less than 1 Hz. The fluid discharge head 11 is fully filled with a desired discharge material, i.e. a discharge fluid. The fluid discharge head 11 is attached to a 3-dimensional robot that individually drives the fluid discharge head 11.

Now, the following will discuss how the electrostatic suction type fluid discharge device of Embodiment 5 operates. First, the stage 12 scans the corona charger 30, or the corona charger 30 scans the stage 12, so that the stage 12 and the corona charger 30 relatively move with respect to each other. While the relative movement is performed, the surface of the insulating substrate 16 is subjected to the charge removal by the corona charger 30.

At the time of subjecting the insulating substrate 16 to the charge removal, an AC voltage of about several kV is applied to the electrode wire 31, so that corona discharge occurs around the electrode wire 31. On this occasion, since the electric potential of the slit electrode 32 is set at about zero, the insulating substrate 16 receives an electric charge that is opposite to an electric charge 50 (negative electric charge in this case) that charges up the insulating substrate 16. In this manner, the charge removal of the insulating substrate 16 is carried out.

Onto the insulating substrate 16 having been subjected to the charge removal, the fluid discharge by the fluid discharge head 11 is performed in line with desired patterning data. On this occasion, the scanning speed of the fluid discharge head 11 is determined in accordance with the relative speed between the fluid discharge head 11 and the stage 12. The tip of the fluid discharge head 11 is controlled in the direction of the Z axis, in such a manner as to keep the gap between the tip and the insulating substrate 16 to always fall within the range of 30 to 200 µm. As the gap measuring means, a displacement gauge using a laser or a gap measuring instrument using a laser is used.

For the fluid discharge by the fluid discharge head 11, the bipolar pulse voltage is supplied from the power source 14 to the drive electrode 13, so that the electric charge starts to move in the discharge fluid, towards the tip of the nozzle. While the electric charge is accumulated in a meniscus that is a fluid interface at the nozzle tip, the electric field strength in the vicinity of the nozzle tip increases. Once the electric field force exceeds a minimum-required discharge force, the discharge of the fluid starts and the fluid lands on the insulating substrate 16.

In the fluid discharge head 11, the drive electrode 13 is driven by the bipolar pulse voltage. For this reason, the fluid discharged from the fluid discharge head 11 is positively and negatively charged in an alternate manner. Therefore, landed on the insulating substrate 16 is always a fluid having the electric charge with such a polarity that restrains the charge-up of the landed dots, and hence the discharge is stably carried out while the charge-up on the insulating substrate 16 is restrained.

As described above, in the electrostatic suction type fluid discharge device of Embodiment 5, the insulating substrate 16 is subjected to the charge removal in advance by the corona charger 30, and then the fluid discharge is performed by the bipolar pulse voltage drive. Therefore, the discharge instability on account of the charge-up on the insulating substrate 16 does not occur. For this reason, minute fluid discharge is stably performed while the scatter at the time of the discharge is restrained, and a clear minute pattern is formed.

Embodiment 6

Figure 24:
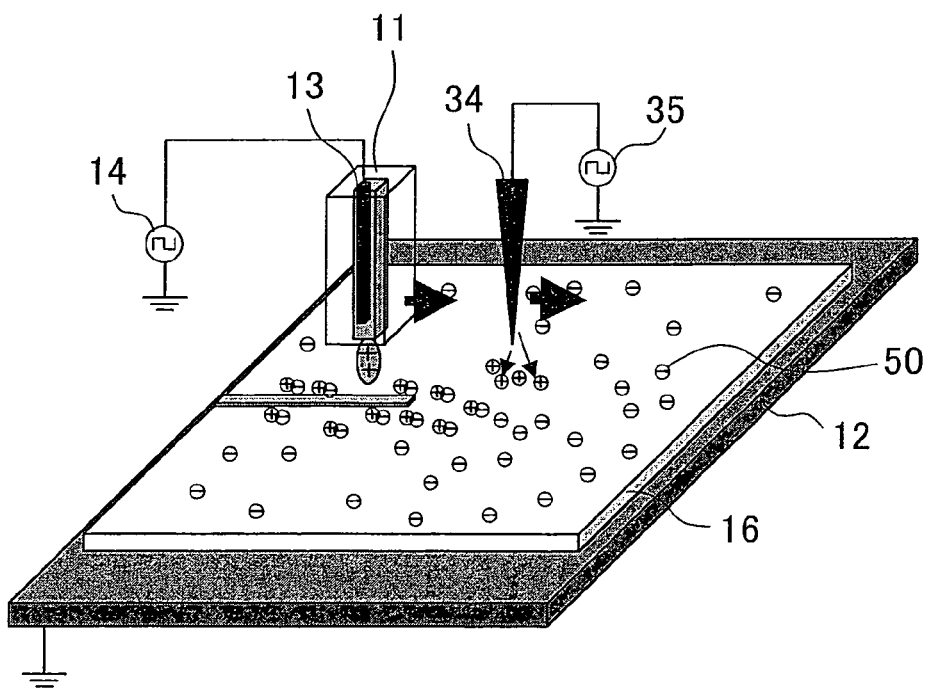
FIG. 24 is an oblique perspective view that outlines an electrostatic suction type fluid discharge device of Embodiment 6.

FIG. 24 shows the electrostatic suction type fluid discharge device of Embodiment 6. In Embodiment 6, descriptions on those identical with Embodiment 5 are omitted, and only the differences are described. While the corona charger is used for the charge removal in Embodiment 5, in Embodiment 6, a needle electrode is used instead.

The following will describe the arrangement of the electrostatic suction type fluid discharge device shown in FIG. 24. In the electrostatic suction type fluid discharge device, a charge removal head 34 and a fluid discharge head 11 are provided in such a manner that the tips of these heads 34 and 11 oppose to the insulating substrate 16. The charge removal head 34 is an insulating needle made of metal or coated with metal, and the diameter of the hole at the tip of the charge removal head 34 is about φ0.1 to 20 µm. The gap between the insulating substrate 16 and the tip of the needle is set so as to be not more than 50 µm. The charge removal head 34 is connected to a power source 35 that individually controls the voltage. Also, the charge removal head 34 is attached to a 3-dimensional robot for individually driving the charge removal head 34.

Now, the charge removal is discussed. First, the charge removal head 34 is driven in 2-dimensional manner in the X and Y directions, in line with desired patterning data. On this occasion, the tip of the head receives an AC voltage while the distance between the tip of the head and the substrate is always kept at not more than 5 µm. On account of this, corona discharge occurs. Whether or not the charge removal is successfully done depends on the diameter of the tip. In a case where the diameter of the tip is not more than φ5 µm, the charge removal by the voltage applied to the tip of the charge removal head 34 is basically successfully done on condition that the amplitude is not less than 400V. A removal charge generated on account of the corona discharge adheres, onto the insulating substrate 16, directly below the charge removal head 34. The removal charge adheres in this manner because of the electric field force between the tip of the charge removal head 34 and the insulating substrate 16. This charge removal is performed while the charge removal head 34 carries out the scanning in the X and Y directions. As a result, on the insulating substrate 16, a part where electricity has been removed is formed in accordance with the desired patterning data.

On the part where the electricity was removed, the fluid is discharged by the fluid discharge head 11 and hence a minute pattern is formed. In this manner, since the charge removal head 34 carries out the scanning in advance in line with the patterning data, the fluid discharge from the fluid discharge head 11 is stably performed in the patterning area. Also, because the charge removal head 34 does not require a high voltage that the corona charger of Embodiment 5 requires, the control can be performed by a cost-effective driver that operates with a low voltage. Moreover, since the charge removal is performed only on a necessary part of the insulating substrate 16, a time for the charge removal is short.

As described above, in the electrostatic suction type fluid discharge device of Embodiment 6, the charge removal is performed in advance with respect to a desired patterning area on the insulating substrate 16, by the needle-shaped charge removal head 34. Thereafter, the fluid discharge is carried out by the bipolar pulse voltage drive. According to this arrangement, it is possible to avoid the occurrence of unstable discharge on account of the charge-up on the insulating substrate 16. Therefore, the minute fluid discharge is stably performed while the scatter at the time of the discharge is restrained, so that a clear minute pattern is formed.

In the description above, the charge removal head 34 and the fluid discharge head 11 are individually driven. Alternatively, these heads may be driven in an integrated fashion.

Embodiment 7

In the fluid discharge head 11, the electric charge, which is supplied from the drive electrode 13 to which a voltage has been applied, moves in the discharge fluid toward the tip of the nozzle, and the electric charge is accumulated in the tip of the nozzle. As a result, the meniscus is formed. The diameter of the meniscus is basically identical with the diameter of the hole of the nozzle.

Once the electric field force generated by the electric charge accumulated in the meniscus exceeds the driving force required for the discharge, the fluid discharge head 11 starts to perform the fluid discharge. In other words, the fluid discharge is performed when a voltage that is not lower than the discharge-start voltage is supplied to the drive electrode 13 of the fluid discharge head 11 having a predetermined nozzle diameter. More specifically, in a case where the nozzle diameter is in the range of φ1 to 10 μm, the discharge-start voltage is about 140V. As the applied voltage increases, an amount of the discharge increases. This increase in the amount of the discharge is useful for discharge in large quantity, which is required in speedy scanning, and also useful for the formation of dots with a long diameter.

However, an applied voltage higher than a predetermined value may be also higher than an aerial discharge starting electric field. More specifically, in a case where the strength of an electric field generated on account of electric charge concentration in the meniscus part is higher than a discharge starting electric field strength which is figured out by the following equation (equation for calculating Paschen curve), discharge on account of dielectric breakdown of air is liable to occur in a high-electric-field portion around the tip of the nozzle. If, in reality, the discharge occurs at the time of the fluid discharge, the scatter of the discharge fluid occurs, and minute droplets land around a desired minute pattern, in a satellite fashion. As a result, an image noise is generated.

$$E = 4.03 \times 10^6 \{1 + 3.08 \times 10^{-2}/D^{0.54} + 4.48 \times 10^{-7}/D^{1.41}\}$$

where E indicates the discharge starting electric field strength (V/m) and D indicates the nozzle diameter (m)

Figure 25:
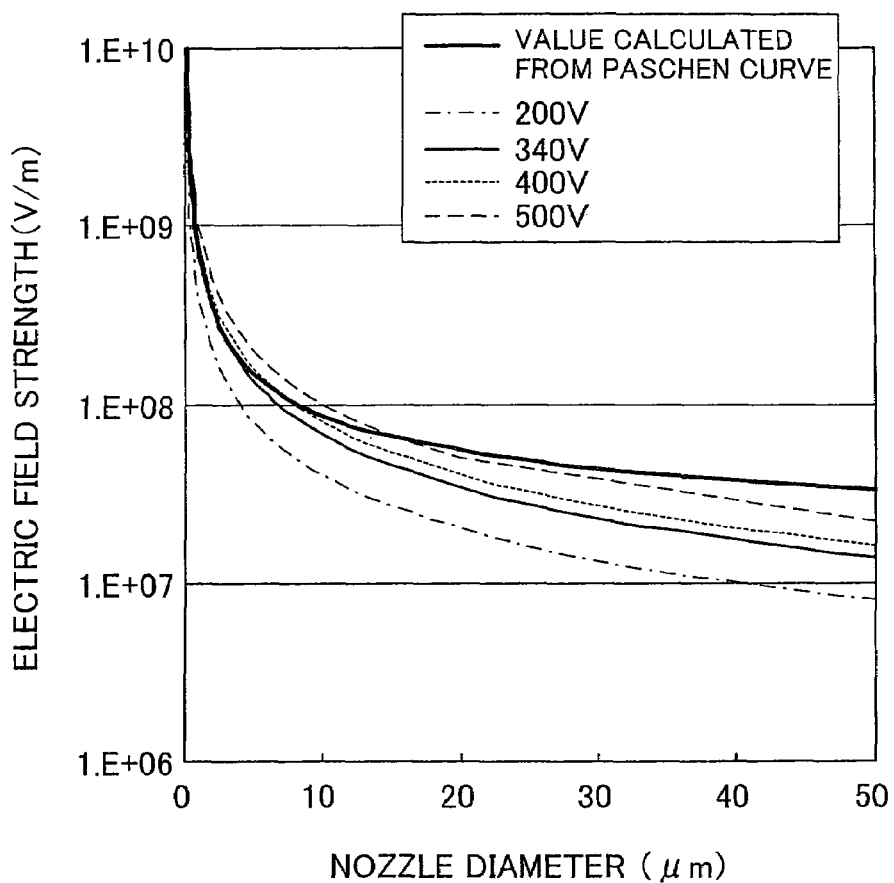
FIG. 25 is a graph showing the relationship between (i) the diameter at the tip of a nozzle and (ii) an electric field strength generated on account of the concentration of electric charge in the meniscus portion, in the electrostatic suction type fluid discharge device.

FIG. 25 is a graph showing the relationship between the diameter of the tip of the nozzle and the strength of the electric field generated on account of the electric charge concentration in the meniscus part, in each of the cases where the applied voltage is 200V, 340V, 400V, and 500V. The graph in FIG. 25 also shows the relationship between the nozzle diameter and the discharge starting electric field strength, which is worked out by the aforesaid equation for calculating Paschen curve.

According to FIG. 25, it is considered that the aerial discharge occurs at the time of the fluid discharge, if the line indicating the relationship between the nozzle diameter and the discharge starting electric field strength at each applied voltage exceeds the line indicating the relationship between the nozzle diameter and the discharge starting electric field strength, which is worked out by the aforesaid equation for calculating Paschen curve.

According to FIG. 25, in a case where the nozzle diameter is in the range of 0.01 to 25 μm as in the electrostatic suction type fluid discharge device of the present invention, the fluid discharge can be carried out totally without fear of the electric discharge, on condition that the applied voltage is not more than 340V. This makes it possible to perform the fluid discharge in a stable manner, with no scatter of droplets, and hence a clear minute pattern is formed. Also according to FIG. 25, in a case where the nozzle diameter is either not less than 16 μm or not more than 0.25 μm, the fluid discharge can be carried out without the electric discharge, on condition that the applied voltage is not more than 500V. In a case where the nozzle diameter is either not less than 7.4 μm or not more than 0.65 μm, the fluid discharge can be carried out without the electric discharge, on condition that the applied voltage is not more than 400V.

As described above, in Embodiment 7, the charge removal is performed in advance with respect to the insulating substrate 16, and the fluid discharge is performed by an applied voltage which is arranged so that the electric field strength at the time of the fluid discharge is lower than the discharge starting electric field strength worked out by the equation for calculating Paschen curve. Therefore, the scatter of droplets to the surrounding on account of electric discharge is restrained, and hence a clear minute pattern image is formed.

In Embodiments 5-7, the drive voltage is a bipolar pulse voltage applied to the drive electrode 13 in the fluid discharge head 11. However, since a voltage required as the driving force is a potential difference between (i) a signal voltage applied to an electrode 210 inside the head and (ii) a voltage applied to the stage 12 side, the drive voltage may be a bipolar pulse voltage applied only to the stage side or a synthesis of the signals applied to the head side and the stage side. Also, the bipolar pulse voltage may have a waveform with a low slew rate, e.g. AC voltage.

Embodiment 8

Figure 26:
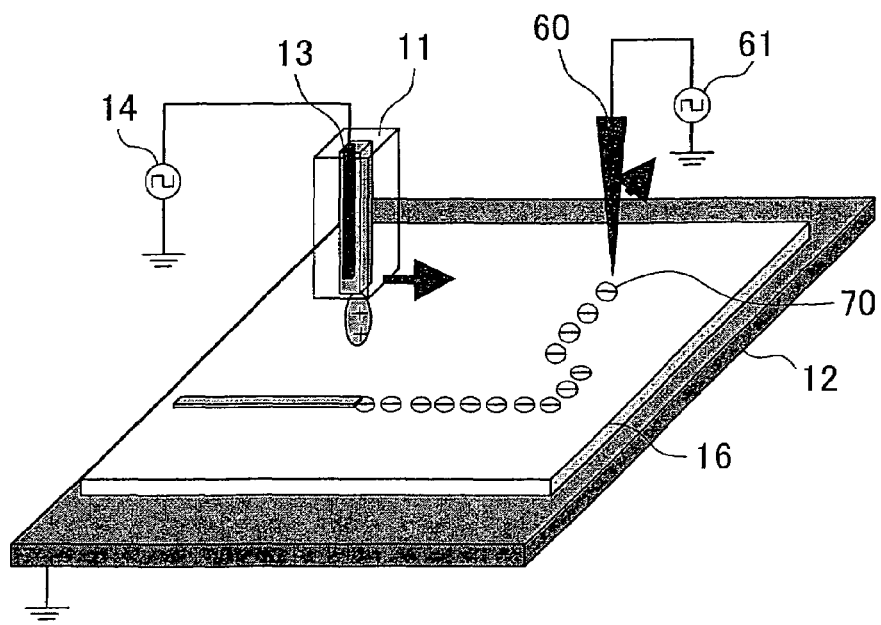
FIG. 26 is an oblique perspective view that outlines an electrostatic suction type fluid discharge device of Embodiment 8.

FIG. 26 shows the electrostatic suction type fluid discharge device of Embodiment 8. In this electrostatic suction type fluid discharge device, the insulating substrate 16 is provided on the stage 12 that is grounded. Furthermore, an electric charge providing head 60 and the fluid discharge head 11 are provided in such a manner that the tips of these heads oppose to the insulating substrate 16.

The electric charge providing head 60 is made of metal or coated with metal, is insulated, is shaped like a needle, and whose tip is φ0.1 to 5 μm in diameter. The gap between the insulating substrate 16 and the tip of the needle is not more than 50 μm. Alternatively, the tip of the electric charge providing head 60 may be in touch with the insulating substrate. The electric charge providing head 60 is connected with a power source 61 that individually controls the voltage. Also, the electric charge providing head 60 is attached to a 3-dimensional robot that individually controls the head 60.

In the fluid discharge head 11, the tip has a hole which is φ1 to 5 μm in diameter. Also, the fluid discharge head 11 includes the drive electrode 13 therein. The drive electrode 13 is connected to a power source 14 that individually controls the voltage. The fluid discharge head 11 is fully filled with a desired discharge material, i.e. a discharge fluid. Being similar to the electric charge providing head 60, the fluid discharge head 11 is also attached to a 3-dimension robot that individually drives the fluid discharge head 11.

Now, the following describes how the electrostatic suction type fluid discharge device of Embodiment 8 operates. First, the electric charge providing head 60 moves in a 2-dimensional manner in the X and Y direction, in line with desired patterning data. On this occasion, the power source 61 supplies a voltage to the tip of the electric charge providing head 60 while the distance between the tip of the electric charge providing head 60 and the insulating substrate 16 is always kept at not more than 5 μm. With this, corona discharge is performed.

Whether or not the voltage applied to the tip of the electric charge providing head 60 is successfully discharged depends on the diameter of the tip. Basically, on condition that the diameter of the tip is not more than φ5 μm, the discharge is successfully done at a voltage of not less than 400V. The discharged electric charge adheres to that part of the insulating substrate 16 which is directly below the electric charge providing head 60, on account of the electric flied force between the tip of the electric charge providing head 60 and the insulating substrate 16. This electric charge adhering to the insulating substrate 16 is termed adhered electric charge 70.

Such discharge is performed while the electric charge providing head 60 performs the scanning in the X and Y direction. As a result, a desired attached electric charge pattern in line with the patterning data is formed on the insulating substrate 16. Subsequently, the fluid discharge head 11 is brought near to a part formed by the adhered electric charge 70, from right above, and a voltage whose polarity is in reverse to that of the adhered electric charge 70 is applied to the drive electrode 13, while the distance between the tip of the head and the surface of the insulating substrate 16 is kept at 30 to 200 μm. The fluid discharge is performed in this condition, so that a pulling electric field force is generated on account of the adhered electric charge 70. On this account, a clear minute pattern is formed.

Figure 27:
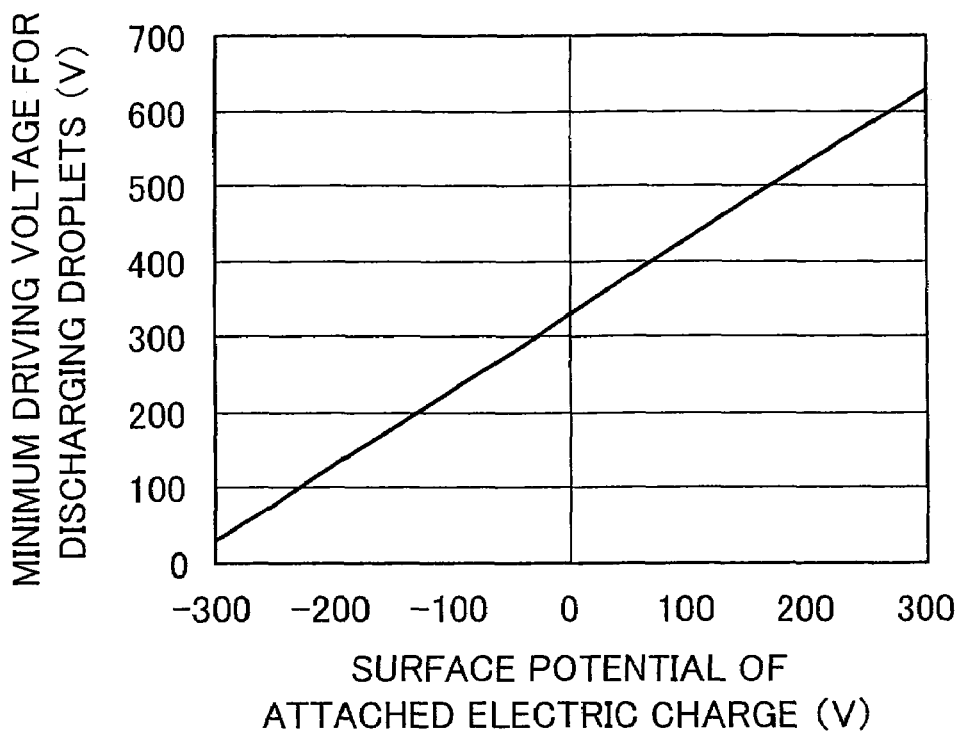
FIG. 27 is a graph showing the relationship between the surface electric potential of an attached electric charge and the drive minimum voltage, at the time of fluid discharge.

As shown in FIG. 27, the drive voltage at the time of performing the fluid discharge depends on the surface electric potential on account of the adhered electric charge 70. The drive voltage can be reduced by increasing an amount of the adhered electric charge in advance.

As described above, according to the electrostatic suction type fluid discharge device of Embodiment 8, the drive voltage is reduced by applying, before the fluid discharge, an electric charge whose polarity is in reverse to the polarity of the drive voltage, to a part where the image drawing is performed. Also, according to the electrostatic suction type fluid discharge device of Embodiment 8, a clear minute pattern is formed by the minute fluid discharge.

Embodiment 9

Figure 28:
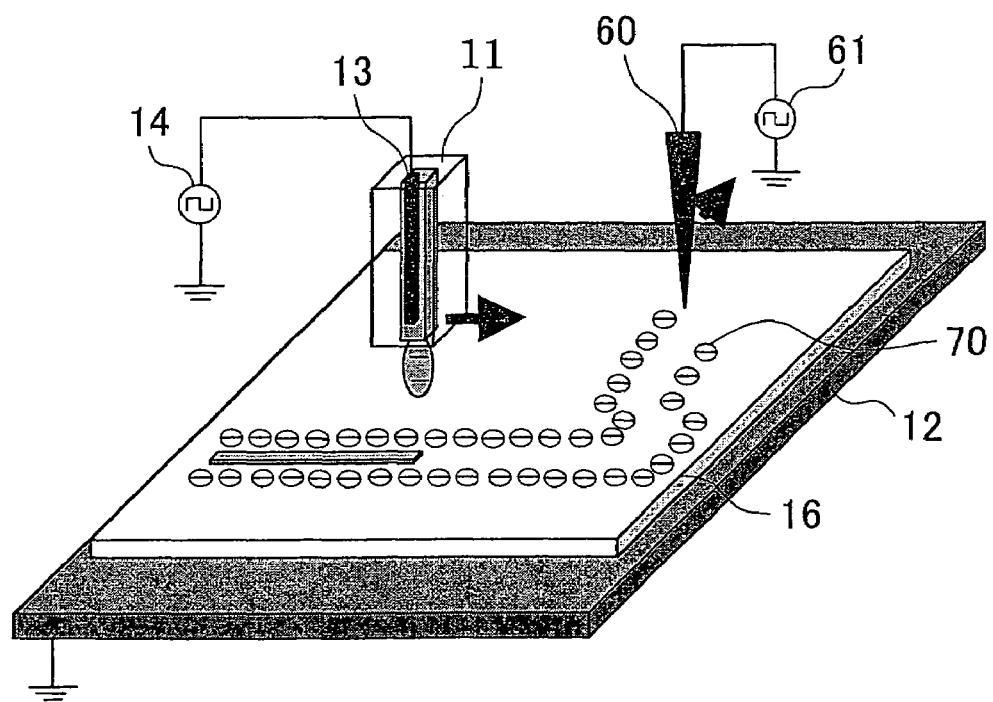
FIG. 28 is an oblique perspective view that outlines an electrostatic suction type fluid discharge device of Embodiment 9.

FIG. 28 shows the electrostatic suction type fluid discharge device of Embodiment 9. In Embodiment 9, descriptions on those identical with Embodiment 8 are omitted, and only the differences are described. The device of Embodiment 9 is identical with that of Embodiment 8. However, while the electrostatic suction type fluid discharge device of Embodiment 8 is arranged such that the electric charge supplied from the electric charge providing head 60 onto the insulating substrate 16 has a polarity in reverse to the polarity of the drive voltage for the fluid discharge, the electric charge applied to the insulating substrate 16 in Embodiment 9 has a polarity identical with the polarity of the drive voltage for the fluid discharge.

The following describes the operation in Embodiment 9. First, the electric charge providing head 60 performs 2-dimensional drive in the X and Y directions, in line with desired patterning data. In doing so, the electric charge providing head 60 has been programmed so that the tip of the electric charge providing head 60 scans the whole of a peripheral area that is several μm to 10 μm away from a desired patterning point. Then the tip of the electric charge providing head 60 receives a voltage while the distance between the tip of the head 60 and the insulating substrate 16 is always kept at not more than 5 μm. As a result, corona discharge occurs. Whether or not the voltage applied to the tip of the electric charge providing head 60 can be discharged depends on the diameter of the tip. Basically, on condition that the diameter of the tip is not more than φ5 μm, the discharge is successfully done at a voltage of not less than 400V.

On account of the electric field force between the tip of the electric charge providing head 60 and the insulating substrate 16, the discharged electric charge adheres onto the insulating substrate 16, as an adhered electric charge 70. Such discharge is performed while the electric charge providing head 60 performs the scanning in the X and Y directions. As a result, on the insulating substrate 16, an adhered electric charge pattern is formed in such a way as to surround a desired pattern.

Subsequently, immediately above the desired pattern part surrounded by the electric charge pattern, the fluid discharge head 11 is brought near to the insulating substrate 16, and a voltage whose polarity is identical with the polarity of the adhered electric charge is applied to the drive electrode 13 while the distance between the tip of the head and the surface of the insulating substrate 16 is kept at 30 to 200 μm. The fluid discharge is performed in this condition. As a result, the discharged fluid receives in a crosswise direction a repulsive electric field force generated on account of the adhered electric charge 70, immediately before landing on the insulating substrate 16. On this account, the droplets land in the direction toward the desired pattern part, and hence a minute pattern is clearly formed.

As described above, in Embodiment 9, the adhered electric charge 70 whose polarity is identical with that of the drive voltage for the fluid discharge is supplied to the insulating substrate 16 in advance, so that it is possible to restrain the landing of the discharged fluid around a desired point, in consequence of the crosswise repulsive force of the adhered electric charge 70. As a result, the pattern is further clarified. Moreover, by optimizing the adhering position of the adhered electric charge 70, it is possible to minimize the width of the line and the diameter of the dots of the desired pattern.

Embodiment 10

Figure 29:
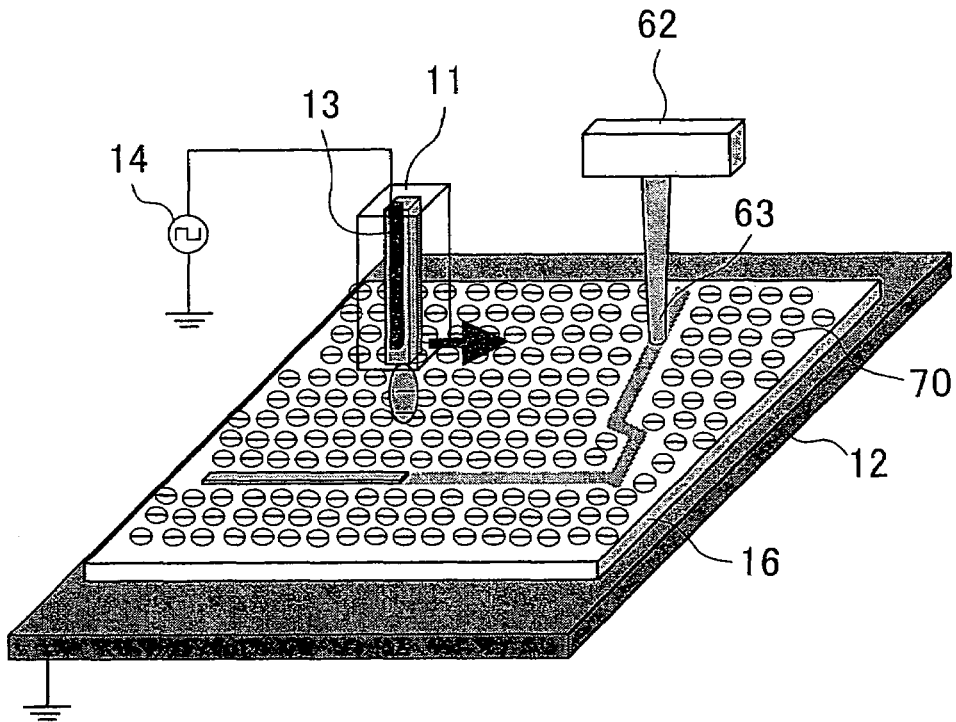
FIG. 29 is an oblique perspective view that outlines an electrostatic suction type fluid discharge device of Embodiment 10.

FIG. 29 shows the electrostatic suction type fluid discharge device of Embodiment 10. In Embodiment 10 descriptions on those identical with Embodiment 9 are omitted, and only the differences are described.

In Embodiment 10, the insulating substrate 16 is made of a photosensitive material. As the means for providing an electric charge to the insulating substrate 16, a uniform electric charge providing system (not illustrated), such as a corona charger, which can cause the entire surface of the insulating substrate 16 to be electrically charged uniformly, is used, instead of the needle-like electric charge providing head of Embodiments 8 and 9.

On the insulating substrate 16 whose surface has been uniformly charged, a laser unit 62 is provided as an charge removal mechanism that removes electricity in line with a predetermined pattern. The laser unit 62 includes a polygon mirror used in electrophotography, a fθ lens, a cylindrical lens, and the like.

Now, the operation in Embodiment 10 is described. First, by the uniform electric charge providing system, the surface of the insulating substrate 16 is uniformly charged. In a case where the electric charge is provided by corona discharge, a desired amount of electric charge is provided onto the insulating substrate 16 by controlling, by a slit voltage of a corona charger, the surface potential of the electric charge.

The insulating substrate 16, which has the uniform electric charge and is made of a photosensitive material, is subjected to the charge removal in such a manner that, by the laser unit 62, a laser 63 is applied only to a desired pattern part. The diameter of the laser spot on this occasion is about 5 μm at minimum. On this account, the formation of the charge removal pattern is highly precisely carried out, as compared to a case where an electric charge is supplied using a needle electrode.

Thereafter, as in the case of Embodiment 9, the fluid discharge head 11 is brought near to the desired electric removal pattern surrounded by the adhered electric charge 70, and a voltage whose polarity is identical with the polarity of the adhered electric charge 70 is applied while the distance between the tip of the head and the surface of the insulating substrate 16 is kept at 30 to 200 μm. The fluid discharge is carried out on this condition. For this reason, a repulsive electric field force generated on account of the adhered electric charge 70 is applied in the crosswise direction, so that a clear minute pattern is formed.

In Embodiment 10, the insulating substrate 16 is an organic photoreceptor, and the uniform electric charging mechanism and the laser electric removal mechanism are used on the insulating substrate 16. On this account, the charge removal pattern is highly precisely formed. Moreover, it is possible to cause the discharged fluid to precisely land on the charge removal pattern, without causing the disturbance in the discharge.

Embodiment 11

Figure 30:
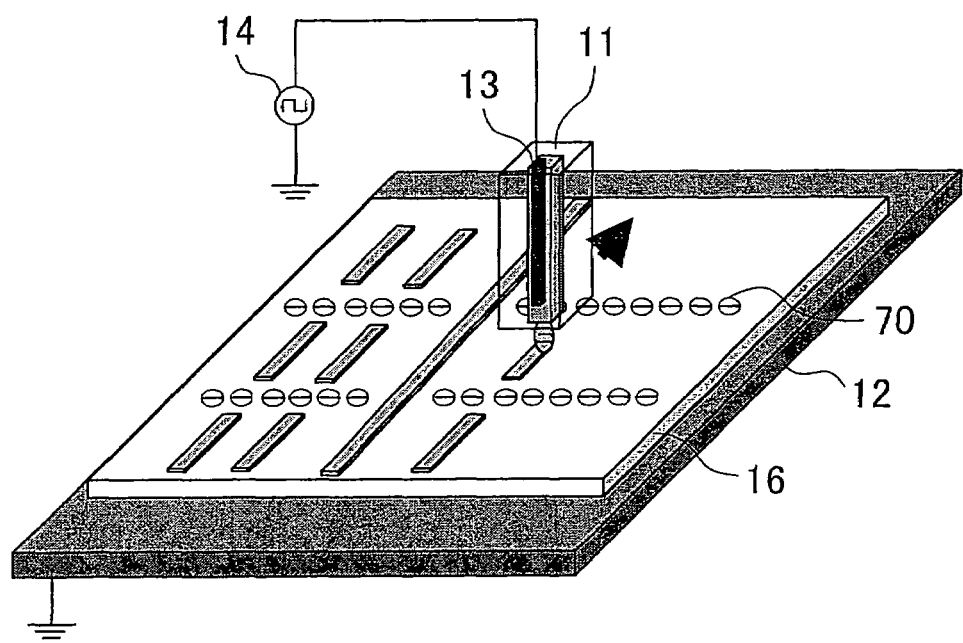
FIG. 30 is an oblique perspective view that outlines an electrostatic suction type fluid discharge device of Embodiment 11.

FIG. 30 shows the electrostatic suction type fluid discharge device of Embodiment 11. In Embodiment 11, descriptions on those identical with Embodiments 8 and 10 are omitted, and only the differences are described.

The electrostatic suction type fluid discharge device of Embodiment 11 is basically identical with the electrostatic suction type fluid discharge device of Embodiment 9. That is, in FIG. 30, the electric charge is provided by means of corona discharge using a needle electrode or by means of contact charge using a minute pattern electrode as shown in Embodiment 9. However, while in Embodiment 9 an electric charge whose polarity is identical with the voltage applied to the discharge fluid is applied to the vicinity of the desired pattern part, an electric charge in Embodiment 11 is supplied to a non-image-drawing part of the desired pattern part.

The operation in Embodiment 11 is described. First, the adhered electric charge 70 is supplied in advance onto the insulating substrate 20, using electric charge providing means which is, for example, corona charger (as the electric charge providing means, for example, the electric charge providing head 60 shown in FIG. 26 or 28 may be used). By the adhered electric charge 70, a desired non-image-drawing pattern is formed. Onto the non-image-drawing pattern, a desired drawing pattern is formed using the fluid discharge head 11. On this occasion, the discharge fluid cannot land on the adhered electric charge 70 that forms the non-image-drawing pattern on the insulating substrate 16, because the discharge fluid selectively receives a repulsive electric field force. For this reason, it is possible to form the non-image drawing pattern between the drawing patterns, without stopping the supply of the drive voltage in the fluid discharge head 11.

In other words, the non-image-drawing pattern formed by the adhered electric charge 70 is formed at a gap in the drawing pattern formed by continuously performing the fluid discharge.

In consideration of the potential difference between the surface potential on the insulating substrate 16 on account of the attached electric charge 70 and the drive voltage of the fluid discharge head 11, the condition for the formation of the non-image drawing pattern is as follows, for example: provided that the insulating substrate 16 is made of polyimide, the non-image-drawing area can be formed on condition that the potential difference is not more than 330V. The size of the non-image-drawing area is controllable by changing the potential difference between the surface potential on the insulating substrate 16 and the drive voltage of the fluid discharge head 11.

In Embodiment 11, the polarity of the electric charge in the pattern corresponding to the non-image-drawing area on the insulating substrate 16 is set in advance so as to be identical with the polarity of the fluid discharge voltage, so that the non-image-drawing area is precisely formed without stopping the fluid discharge head 11. Moreover, the size of the non-image-drawing area is controllable by controlling the difference between the surface potential of the attached electric charge 50 and the drive voltage of the head.

Embodiment 12

Figure 31:
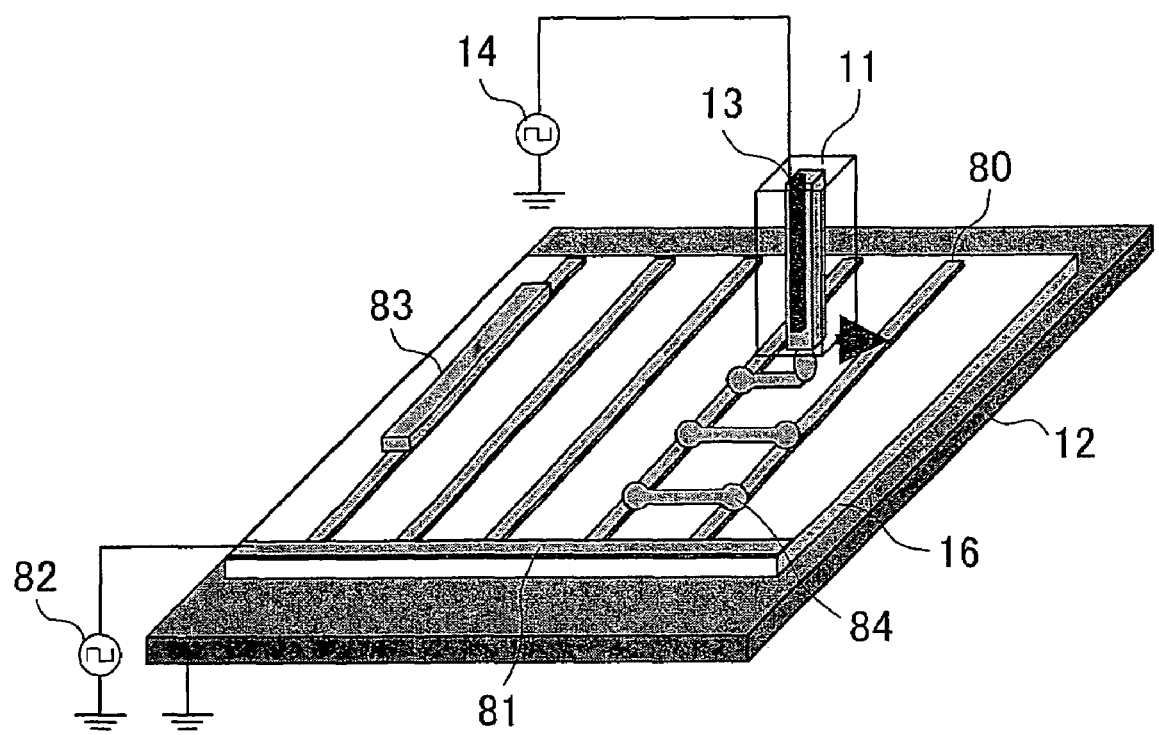
FIG. 31 is an oblique perspective view that outlines an electrostatic suction type fluid discharge device of Embodiment 12.
Figure 32:
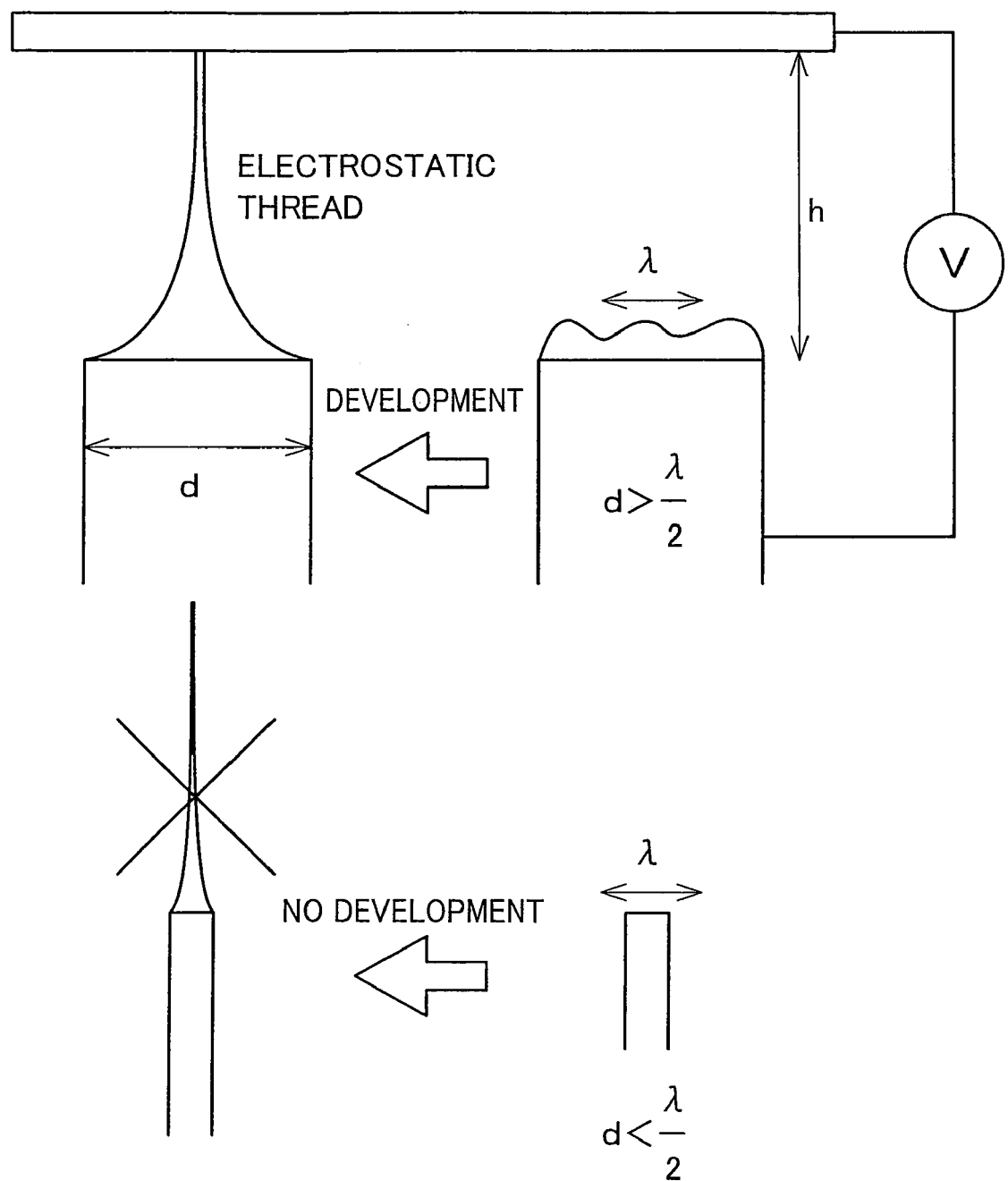
FIG. 32 illustrates the principle of the development of a discharge fluid on account of electrostatic thread-like phenomenon, in the electrostatic suction type fluid discharge device.

FIG. 31 shows the electrostatic suction type fluid discharge device of Embodiment 12. In Embodiment 12, descriptions on those identical with Embodiments 8 and 11 are omitted, and only the differences are described.

The electrostatic suction type fluid discharge device of Embodiment 12 is designed for highly precisely performing, on the insulating substrate 16 having the conductive pattern 80, the fluid discharge for over-painting the line of the conductive pattern 80 which has been formed or for connecting the lines of the conductive pattern 80.

For the over-painting of the line or the connection of the lines by the aforesaid electrostatic suction type fluid discharge device, a common electrode 81 is provided at the periphery of the conductive pattern 80 which has been formed on the insulating substrate 16. The common electrode 81 is one of the members of the electrostatic suction type fluid discharge device, and is provided so as to touch the periphery of the conductive pattern 80 at the time of performing the drawing on the insulating substrate 16. To allow the common electrode 81 to conduct voltage control, the common electrode 81 is connected to a power source 82.

The operation in Embodiment 12 is described. As shown in FIG. 31, a voltage is supplied from the power source 82 to the common electrode 81, and a voltage whose polarity is in reverse to the polarity of the common electrode 81 is applied to the fluid discharge head 11. As a result, the fluid is discharged onto the conductive pattern 80 being in touch with the common electrode 81, in a concentrated manner.

On this occasion, the larger the potential difference between the common electrode 81 and the drive electrode 13 of the fluid discharge head 11 is, the more the discharge onto the conductive pattern 80 is concentrated. This concentration is particularly effective for drawing an over-painting discharge pattern 83 on the conductive pattern 80 or for drawing a connecting pattern 84 by which conductive patterns 80 are connected to each other.

To connect the conductive patterns 80 with each other, it is preferable to slightly increase an amount of the discharge onto the connection part so as to increase the size of the overlapping part of the lines, in order to minimize the contact resistance at the connection part. The amount of the discharge can be controlled by changing the voltage applied to the common electrode 81.

In Embodiment 12, a voltage is supplied in advance to the conductive pattern 80 on the insulating substrate 20, so that the discharge onto the conductive pattern 80 is performed in a concentrated manner. On this account, the over-painting of the line and the connection of the lines are precisely carried out.

In Embodiments 8-12, the drive voltage is a voltage applied to the drive electrode 13 in the fluid discharge head 11. However, since a voltage required as the driving force is a potential difference between (i) a signal voltage applied to the electrode 13 inside the head 11 and (ii) a voltage applied to the stage 12 side, the form of the signal on each electrode can be optionally determined. Furthermore, the drive voltage may be positive or negative.

INDUSTRIAL APPLICABILITY

The invention is applicable to a device drawing a conductive wiring pattern on an insulating substrate, inkjet printers, and the like.

The invention claimed is:

1. An electrostatic suction type fluid discharge device, in which drive voltage supply means supplies a drive voltage between a nozzle and a discharge target and hence an electric charge is applied to a fluid supplied into the nozzle, so that the fluid is discharged as droplets from a hole of the nozzle to the discharge target, the hole of the nozzle falling within a range between $\phi 0.01$ μm and $\phi 25$ μm in diameter, and the drive voltage supply means outputting, as the drive voltage, a bipolar pulse voltage which has a frequency of not less than 1 Hz, and which alternates between positive and negative such that positively charged fluid droplets and negatively charged fluid droplets are alternately discharged in accordance with a polarity of the bipolar pulse voltage applied as the drive voltage and alternately landed on the discharge target.

2. An electrostatic suction type fluid discharge device, in which drive voltage supply means supplies a drive voltage between a nozzle and a discharge target and hence an electric charge is applied to a fluid supplied into the nozzle, so that the fluid is discharged as droplets from a hole of the nozzle to the discharge target, the hole of the nozzle falling within a range between $\phi 0.01$ μm and $\phi 25$ μm in diameter, and the drive voltage supply means outputting, as the drive voltage, a bipolar pulse voltage which alternates between positive and negative such that positively charged fluid droplets and negatively charged fluid droplets are alternately discharged in accordance with a polarity of the bipolar pulse voltage applied as the drive voltage and alternately landed on the discharge target, and which satisfies $f \leq 1/(2\tau)$ where $\tau$ is a time constant determined by $\tau = \in/\sigma$, f is a drive voltage frequency (Hz), $\sigma$ is an electric conductivity (S/m) of the discharge fluid, and $\in$ is a relative permittivity of the discharge fluid.

3. An electrostatic suction type fluid discharge device, in which drive voltage supply means supplies a drive voltage between a nozzle and a discharge target and hence an electric charge is applied to a fluid supplied into the nozzle, so that the fluid is discharged as droplets from a hole of the nozzle to the discharge target, and the nozzle and the discharge target are moved in a relative manner by shifting means, in a direction orthogonal to a direction along which the nozzle and the discharge target oppose to each other, the hole of the nozzle falling within a range between $\phi 0.01$ μm and $\phi 25$ μm in diameter, the drive voltage supply means outputting, as the drive voltage, a bipolar pulse voltage which has a frequency of f Hz and which alternates between positive and negative such that positively charged fluid droplets and a negatively charged fluid droplets are alternately discharged in accordance with a polarity of the bipolar pulse voltage applied as the drive voltage and alternately landed on the discharge target, and the electrostatic suction type fluid discharge device further comprises control means that controls at least one of the drive voltage supply means and the shifting means in such a manner as to satisfy $f \leq 5v$ where f is a drive voltage frequency (Hz) of the drive voltage supply means and v indicates a relative speed (μm/sec) of the relative movement of the nozzle and the discharge target.

4. An electrostatic suction type fluid discharge device, in which drive voltage supply means supplies a drive voltage between a nozzle and a discharge target and hence an electric charge is applied to a fluid supplied into the nozzle, so that the fluid is discharged as droplets from a hole of the nozzle to the discharge target, and the nozzle and the discharge target are moved in a relative manner by shifting means, in a direction orthogonal to a direction along which the nozzle and the discharge target oppose to each other, the hole of the nozzle falling within a range between $\phi 0.01$ μm and $\phi 25$ μm in diameter, and the drive voltage supply means outputting, as the drive voltage, a bipolar pulse voltage which is not more than 400V and which alternates between positive and negative such that positively charged fluid droplets and negatively charged fluid droplets are alternately discharged in accordance with a polarity of the bipolar pulse voltage applied as the drive voltage and alternately landed on the discharge target.

5. An electrostatic suction type fluid discharge method, in which a drive voltage is supplied between a nozzle and a discharge target and hence an electric charge is applied to a fluid supplied into the nozzle, so that the fluid is discharged as droplets from a hole of the nozzle to the discharge target, the hole of the nozzle falling within a range between $\phi 0.01$ μm and $\phi 25$ μm in diameter, and the drive voltage being a bipolar pulse voltage which has a frequency of not less than 1 Hz and alternates between positive and negative such that positively charged fluid droplets and a negatively charged fluid droplets are alternately discharged in accordance with a polarity of the bipolar pulse voltage applied as the drive voltage and alternately landed on the discharge target.

6. An electrostatic suction type fluid discharge method, in which a drive voltage is supplied between a nozzle and a discharge target and hence an electric charge is applied to a fluid supplied into the nozzle, so that the fluid is discharged as droplets from a hole of the nozzle to the discharge target, the hole of the nozzle falling within a range between φ0.01 μm and φ25 μm in diameter, and the drive voltage being a bipolar pulse voltage which alternates between positive and negative such that positively charged fluid droplets and negatively charged fluid droplets are alternately discharged in accordance with a polarity of the bipolar pulse voltage applied as the drive voltage and alternately landed on the discharge target, and which satisfies f≦1/(2τ) where τ is a time constant determined by τ=∈/σ, f is a drive voltage frequency (Hz), σ is an electric conductivity (S/m) of the discharge fluid, and ∈ is a relative permittivity of the discharge fluid.

7. An electrostatic suction type fluid discharge method, in which a drive voltage is supplied between a nozzle and a discharge target and hence an electric charge is applied to a fluid supplied into the nozzle, so that the fluid is discharged as droplets from a hole of the nozzle to the discharge target, and the nozzle and the discharge target are moved in a relative manner, in a direction orthogonal to a direction along which the nozzle and the discharge target oppose to each other, the hole of the nozzle falling within a range between φ0.01 μm and φ25 μm in diameter, as the drive voltage, a bipolar pulse voltage which has a frequency of f Hz being outputted and alternates between positive and negative such that positively charged fluid droplets and a negatively charged fluid droplets are alternately discharged in accordance with a polarity of the bipolar pulse voltage applied as the drive voltage and alternately landed on the discharge target, and at least one of the drive voltage frequency fHz and a relative speed vμm/sec of the relative movement of the nozzle and the discharge target being controlled in such a manner as to satisfy f≦5v.

8. An electrostatic suction type fluid discharge method, in which a drive voltage is supplied between a nozzle and a discharge target and hence an electric charge is applied to a fluid supplied into the nozzle, so that the fluid is discharged as droplets from a hole of the nozzle to the discharge target, the hole of the nozzle falling within a range between φ0.01 μm and φ25 μm in diameter, and the drive voltage being a bipolar pulse voltage which is not more than 400V and which alternates between positive and negative such that positively charged fluid droplets and negatively charged fluid droplets are alternately discharged in accordance with a polarity of the bipolar pulse voltage applied as the drive voltage and alternately landed on the discharge target.

9. An electrostatic suction type fluid discharge device that
(i) discharges, by electrostatic suction, a discharge fluid as droplets through a fluid discharge hole of a nozzle of a fluid discharge head, the discharge fluid being electrically charged by voltage application, and (ii) causes the discharge fluid to land onto a substrate, (iii) so as to form a drawing pattern by the discharge fluid on a surface of the substrate,
the fluid discharge hole of the nozzle falling in a range between 0.01 μm and 25 μm in diameter, and
the substrate being insulating,
the electrostatic suction type fluid discharge device comprising:

charge removal means for removing an electric charge on the surface of the substrate, before the discharge fluid is discharged onto the substrate; and fluid discharge means for discharging the droplets of discharge fluid onto the substrate from which the electricity has been removed by a bipolar pulse voltage which alternates between positive and negative such that positively charged fluid droplets and negatively charged fluid droplets are alternately discharged in accordance with a polarity of the bipolar pulse voltage applied as the drive voltage and alternately landed on the substrate.

10. The electrostatic suction type fluid discharge device as defined in claim 9, wherein, the charge removal means removes the electricity on the substrate, in line with a predetermined pattern.

11. The electrostatic suction type fluid discharge device as defined in claim 9, wherein, the fluid discharge means discharges the discharge fluid by applying a voltage which is arranged such that an electric field strength generated by electric charge concentration at a meniscus part, when discharging the discharge fluid, is smaller than a discharge start electric field strength figured out by an equation for calculating Paschen curve.

12. The electrostatic suction type fluid discharge device as defined in claim 11, wherein, the voltage applied when the fluid discharge means discharges the discharge fluid is not less than 340V.

13. The electrostatic suction type fluid discharge device as defined in claim 11, wherein, the fluid discharge hole of the nozzle is not less than 16 μm or not more than 0.25 μm in diameter, and the voltage applied when the fluid discharge means discharges the discharge fluid is not more than 500V.

14. The electrostatic suction type fluid discharge device as defined in claim 11, wherein, the fluid discharge hole of the nozzle is not less than 7.4 μm or not more than 0.65 μm in diameter, and the voltage applied when the fluid discharge means discharges the discharge fluid is not more than 400V.

15. An electrostatic suction type fluid discharge method in which (i) by electrostatic suction, a discharge fluid is discharged as droplets through a fluid discharge hole of a nozzle of a fluid discharge head, the discharge fluid being electrically charged by voltage application, and (ii) the discharge fluid droplets are caused to land onto a substrate, (iii) so that a drawing pattern is formed by the discharge fluid droplets on a surface of the substrate, the fluid discharge hole of the nozzle falling in a range between 0.01 μm and 25 μm in diameter, and the substrate being insulating, an electric charge on the surface of the substrate being removed, before the discharge fluid is discharged onto the substrate, and the discharge fluid being discharged onto the substrate from which electricity has been removed by a bipolar pulse voltage such that positively charged fluid droplets and negatively charged fluid droplets are alternately discharged in accordance with a polarity of the bipolar pulse voltage applied as the drive voltage and caused to alternately land on the substrate.

* * * * *